United States Patent
Won et al.

(10) Patent No.: US 12,127,449 B2
(45) Date of Patent: Oct. 22, 2024

(54) DISPLAY DEVICE

(71) Applicant: SAMSUNG DISPLAY CO., LTD., Yongin-si (KR)

(72) Inventors: Byeonghee Won, Yongin-si (KR); Sangwoo Kim, Yongin-si (KR); Jaemin Shin, Yongin-si (KR); Gyujeong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 411 days.

(21) Appl. No.: 16/937,038

(22) Filed: Jul. 23, 2020

(65) Prior Publication Data

US 2021/0193774 A1    Jun. 24, 2021

(30) Foreign Application Priority Data

Dec. 18, 2019  (KR) .................. 10-2019-0170204

(51) Int. Cl.
*H10K 59/131*    (2023.01)
*H10K 77/10*     (2023.01)
*G09G 3/3233*    (2016.01)

(52) U.S. Cl.
CPC ......... *H10K 59/131* (2023.02); *H10K 77/111* (2023.02); *G09G 3/3233* (2013.01); *G09G 2300/0426* (2013.01); *G09G 2300/0809* (2013.01); *G09G 2310/0202* (2013.01); *G09G 2380/02* (2013.01)

(58) Field of Classification Search
CPC .................. H01L 27/3248; H01L 27/3276
See application file for complete search history.

(56) References Cited

U.S. PATENT DOCUMENTS

| | | | |
|---|---|---|---|
| 10,038,163 B2 | 7/2018 | Kim et al. | |
| 10,263,062 B2 | 4/2019 | Park et al. | |
| 10,461,142 B2 | 10/2019 | Hong et al. | |
| 2008/0017859 A1* | 1/2008 | Tai | H01L 27/124 |
| | | | 257/E27.111 |
| 2016/0268352 A1* | 9/2016 | Hong | H10K 59/88 |
| 2018/0108310 A1* | 4/2018 | Dong | G02F 1/13452 |
| 2018/0114825 A1* | 4/2018 | Hong | H10K 59/124 |
| 2019/0207155 A1* | 7/2019 | Lee | H01L 51/56 |

FOREIGN PATENT DOCUMENTS

KR   1020170113934   10/2017
KR   10-2018-0045968   5/2018

* cited by examiner

*Primary Examiner* — Tuan A Hoang
(74) *Attorney, Agent, or Firm* — F. CHAU & ASSOCIATES, LLC

(57) ABSTRACT

A display device includes: a substrate that includes an island portion, a first connector that extends in a first direction from the island portion and a second connector that extends from the island portion in a second direction that crosses the first direction; a display unit disposed on the island portion and that includes at least one thin film transistor and at least one display element connected to the at least one thin film transistor; and connecting wires disposed on the first connector and the second connector and connected to the display unit, wherein at least one of the connecting wires is disposed on a same layer as a semiconductor layer of the at least one thin film transistor.

13 Claims, 22 Drawing Sheets

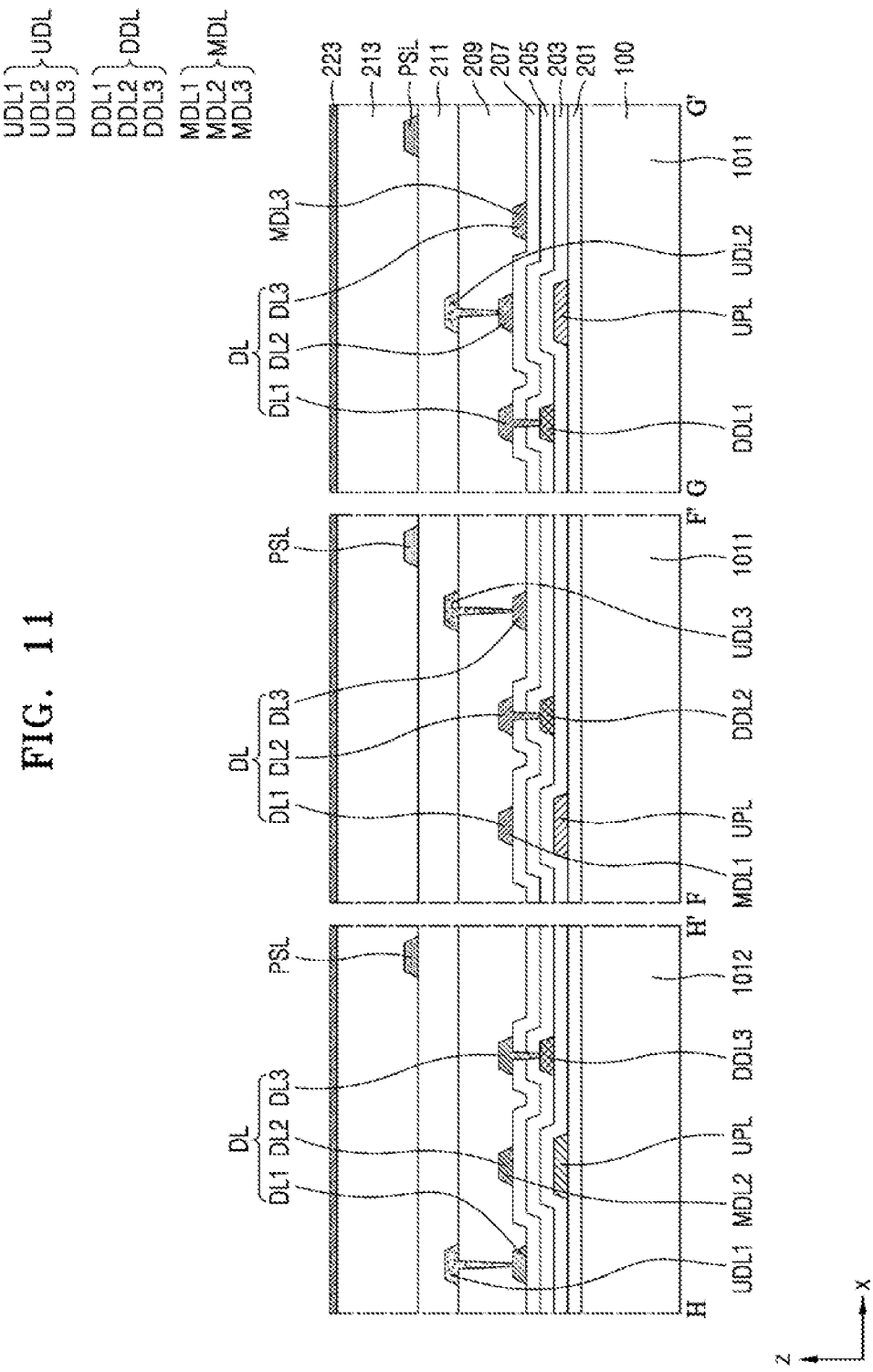

DISPLAY DEVICE

CROSS-REFERENCE TO RELATED APPLICATION

This application claims priority under 35 U.S.C. § 119 from, and the benefit of Korean Patent Application No. 10-2019-0170204, filed on Dec. 18, 2019 in the Korean Intellectual Property Office, the contents of which are herein incorporated by reference in their entirety.

BACKGROUND

1. Technical Field

One or more embodiments are directed to a display device.

2. Discussion of the Related Art

As display devices for visually displaying visual information have been developed, various display devices that are thin, light in weight, and have low power consumption have been introduced. Recently, flexible display devices that can be folded or rolled have been developed, and further, stretchable display devices that can be changed into various forms have been actively studied.

SUMMARY

To increase the flexibility of a substrate of a deformable display device, the deformable display device includes an island portion on which a display unit is disposed and a connector that extends from the island portion and includes wires disposed thereon.

One or more embodiments include a display device capable of minimizing a width of a connector that includes wires disposed thereon.

According to one or more embodiments, a display device includes a substrate that includes an island portion, a first connector that extends from the island portion in a first direction, and a second connector that extends from the island portion in a second direction that crosses the first direction; a display unit that includes at least one thin film transistor disposed on the island portion and at least one display element connected to the at least one thin film transistor; and connecting wires disposed on the first connector and the second connector and connected to the display unit, wherein at least one of the connecting wires is disposed on a same layer as a semiconductor layer of the at least one thin film transistor.

In an embodiment, the connecting wires include a first wire and a second wire. The first wire of the first connector is disposed on the same layer as the semiconductor layer and the second wire of the first connector is electrically connected to an opposite electrode of the display element.

In an embodiment, the first wire and the second wire overlap each other.

In an embodiment, a plurality of insulating layers are disposed between the first wire and the second wire.

In an embodiment, a first data line, a second data line, and a third data line connected to the display unit are disposed on the island portion. The connecting wires of the first connector include an intermediate conductive pattern connected to the first data line that is disposed on a same layer as the intermediate conductive pattern, a lower conductive pattern disposed below the intermediate conductive pattern and connected to the second data line, and an upper conductive pattern disposed on the intermediate conductive pattern and connected to the third data line.

In an embodiment, at least one insulating layer is interposed between the upper conductive pattern and the intermediate conductive pattern.

In an embodiment, the lower conductive pattern and the first wire are spaced apart from each other in a direction parallel to the upper surface of the substrate.

In an embodiment, the lower conductive pattern includes a first conductive pattern and a second conductive pattern with at least one first insulating layer interposed therebetween.

At least one second insulating layer is interposed between the second conductive pattern and the intermediate conductive pattern.

In an embodiment, the first conductive pattern and the second conductive pattern extend to the island portion and are connected to each other through a contact hole that penetrates the at least one first insulating layer.

In an embodiment, the connecting wires are disposed on a third connector that extends from the island portion in a direction parallel to the first direction, wherein the third connector includes the lower conductive pattern connected to the first data line, the upper conductive pattern connected to the second data line, and the intermediate conductive pattern connected to the third data line.

In an embodiment, the connecting wires include a first wire and a second wire. The second wire of the second connector is electrically connected to the opposite electrode of the display element, and the first wire of the second connector is disposed on the second wire, wherein the second wire is disposed on the same layer as the semiconductor layer.

In an embodiment, the first wire and the second wire may overlap each other.

In an embodiment, an insulating layer is interposed between the first wire and the second wire.

In an embodiment, the connecting wires further include at least one scan line that transmits a scan signal, and the at least one scan line is disposed on a first insulating layer that covers the second wire.

In an embodiment, the at least one scan line and the second wire are spaced apart from each other in a direction parallel to the upper surface of the substrate.

In an embodiment, the at least one scan line includes a first scan line and a second scan line. The first scan line is disposed on the first insulating layer that covers the second wire, and the second scan line is disposed on the second insulating layer that covers the first scan line.

According to one or more embodiments, a display device includes a substrate that includes an island portion, a first connector that extends from the island portion in a first direction, and a second connector that extends from the island portion in a second direction that crosses the first direction; a display unit that includes at least one thin film transistor disposed on the island portion and at least one display element connected to the at least one thin film transistor; and connecting wires disposed on the first connector and the second connector and connected to the display unit, where an inorganic insulating layer is disposed on a portion of at least one of the first connector or the second connector, and a lower organic insulating layer is disposed on another portion of at least one of the first connector or the second connector.

According to one or more embodiments, a display device includes a substrate that includes an island portion, a first connector that extends from the island portion in a first direction, and a third connector spaced apart from the first connector and that extends from the island portion in a direction parallel to the first direction; a display unit disposed on the island portion and that includes thin-film transistors and display elements connected to the thin-film transistors, respectively; data lines respectively connected to the thin-film transistors and disposed on a same layer as the island portion; and connecting wires disposed on the first connector and the third connector and connected to the data lines, respectively, where the connecting wires include an upper conductive pattern, an intermediate conductive pattern, and a lower conductive pattern disposed on different layers.

In an embodiment, in the first connector, the intermediate conductive pattern is connected to a first data line of the data lines, where the first data line is disposed on the same layer as the intermediate conductive pattern, the lower conductive pattern is disposed below the intermediate conductive pattern and connected to a second data line of the data lines, and the upper conductive pattern is disposed on the intermediate conductive pattern and connected to a third data line of the data lines.

In an embodiment, in the third connector, the intermediate conductive pattern is connected to the third data line that is disposed on the same layer as the intermediate conductive pattern, the lower conductive pattern is disposed below the intermediate conductive pattern and connected to the first data line, and the upper conductive pattern is disposed on the intermediate conductive pattern and connected to the second data line.

In an embodiment, the lower conductive pattern includes a first lower conductive pattern and a second lower conductive pattern with a first interlayer insulating layer interposed therebetween, and a second interlayer insulating layer is interposed between the second lower conductive pattern and the intermediate conductive pattern.

In an embodiment, the connecting wires include a first wire and a second wire,

And the first wire of the first connector is disposed on a same layer as a semiconductor layer of the thin-film transistors, and a second wire of the first connector is connected to an opposite electrode of the display element.

In an embodiment, the lower conductive pattern includes a first conductive pattern and a second conductive pattern with a first interlayer insulating layer interposed therebetween, and the first conductive pattern and the second conductive pattern extend to the island portion and are connected through a contact hole that penetrates the first interlayer insulating layer.

In an embodiment, the island portion further includes a second connector that extends from the island portion in a second direction that crosses the first direction, and the second connector includes a second wire connected to the opposite electrode of the display element and a first wire disposed on the second wire, where the second wire is disposed on the same layer as the semiconductor layer of the thin-film transistors.

In an embodiment, the connecting wires further include at least one scan line that transmits a scan signal, and the at least one scan line includes a first scan line and a second scan line disposed on the first interlayer insulating layer that covers the first scan line.

BRIEF DESCRIPTION OF THE DRAWINGS

FIG. 11 is a cross-sectional view of a display device taken along line F-F', line G-G', and line H-H' of FIG. 8.

DETAILED DESCRIPTION

Figure 1:
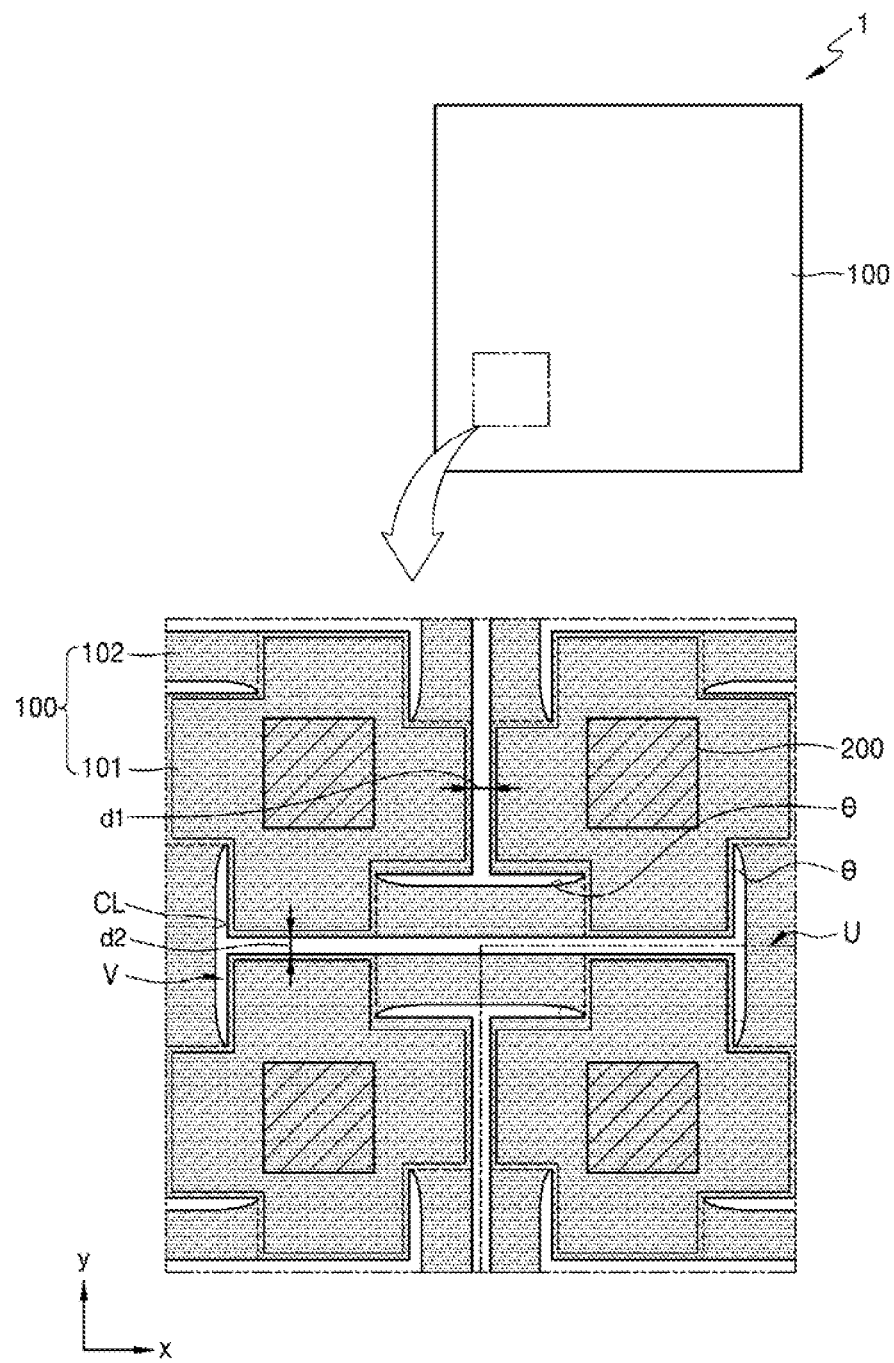
FIG. 1 is a plan view of a display device according to an embodiment.

Reference will now be made in detail to embodiments, examples of which are illustrated in the accompanying drawings, wherein like reference numerals may refer to like elements throughout. In this regard, embodiments may have different forms and should not be construed as being limited to the descriptions set forth herein.

An expression used in the singular encompasses the expression of the plural, unless it has a clearly different meaning in the context.

It will be understood that when a layer, region, or element is referred to as being "formed on" another layer, region, or element, it can be directly or indirectly formed on the other layer, region, or element.

Sizes of elements in the drawings may be exaggerated for convenience of explanation.

It will be understood that when a layer, region, or component is connected to another portion, the layer, region, or component may be directly connected to the portion or an intervening layer, region, or component may exist.

FIG. 1 is a plan view of a display device according to an embodiment.

Referring to FIG. 1, a display device 1 according to an embodiment includes a substrate 100 and a display unit 200 on the substrate 100.

According to an embodiment, the display device 1 displays an image, and may be a portable mobile device such as a game machine, a multimedia device, or a micro PC. The display device 1 to be described below may include a liquid crystal display, an electrophoretic display, an organic light-emitting display, an inorganic light-emitting display, a field emission display, a surface-conduction electron-emitter display, a quantum dot display, a plasma display, or a cathode ray display. Hereinafter, although an organic light-emitting display will be described as an example of the display device 1 according to an embodiment, various other kinds of display devices as described above may be used in embodiments.

According to an embodiment, the substrate 100 includes one or more of various materials such as glass, metal, or an organic material. In an embodiment, the substrate 100 includes a flexible material. For example, the substrate 100 may include an ultra-thin flexible glass having a thickness of e.g., several tens to hundreds of um, or a polymer resin. When the substrate 100 includes a polymer resin, the polymer resin may be one or more of polyethersulphone, polyarylate, polyetherimide, polyethylene naphthalate, polyethylene terephthalate, polyphenylene sulfide, polyimide, polycarbonate, or cellulose acetate propionate, etc.

According to an embodiment, the substrate 100 includes a plurality of island portions 101 that are spaced apart from each other, a plurality of connectors 102 that connect the plurality of island portions 101, and a plurality of separation areas V between the plurality of connectors 102 that penetrate the substrate 100.

According to an embodiment, the plurality of island portions 101 are spaced apart from each other. For example, the plurality of island portions 101 form planar lattice patterns that are repeatedly arranged in a first direction, such as a y direction, and a second direction, such as an x direction, that crosses the first direction. In an embodiment, the first direction and the second direction are perpendicular to each other. In another embodiment, the first direction and the second direction form an obtuse angle or an acute angle. Hereinafter, for convenience of description, a case where the first direction and the second direction are perpendicular to each other will be mainly described in detail.

According to an embodiment, the display unit 200 is disposed on the plurality of island portions 101 and defines at least one pixel area. The pixel includes at least one thin-film transistor and a display element connected to the at least one thin-film transistor and that emits light in a visible light band. In an embodiment, a red pixel, a green pixel, and a blue pixel are disposed on each of the island portions 101. In another embodiment, a red pixel, a green pixel, a blue pixel, and a white pixel are disposed on each of the island portions 101. Hereinafter, a case in which a red pixel, a green pixel, and a blue pixel are disposed on each of the island portions 101 will be mainly described in detail.

According to an embodiment, the plurality of connectors 102 connect the neighboring island portions 101 to each other. For example, four connectors 102 are connected to each of the island portions 101. The four connectors 102 connected to one island portion 101 extend in different directions, and each of the connectors 102 is connected to a connector 102 of an adjacent island portion 101. In this case, the connector 102 that connects the adjacent island portions 101 are integrally provided. For example, one island portion 101 may be connected to four adjacent island portions 101 that surround the one island portion 101 through the four connectors 102, respectively.

According to an embodiment, the plurality of island portions 101 and the plurality of connectors 102 are continuously formed of the same material. That is, the plurality of island portions 101 and the plurality of connectors 102 are integrally provided.

Hereinafter, according to an embodiment, for convenience of description, one island portion 101 and the connectors 102 connected thereto are referred to as one basic unit U, and the structure of the substrate 100 and the structure of the display device will be described in detail based on this one basic unit U. The basic unit U is repeatedly arranged in a first direction and a second direction, and the substrate 100 is provided with the basic units U repeatedly arranged. Two basic units U adjacent to each other are symmetrical to each other. For example, in FIG. 1, two horizontally adjacent basic units U are horizontally symmetrical with respect to an axis of symmetry between the basic units U and parallel to the y direction. Similarly, in FIG. 1, two vertically adjacent basic units U are vertically symmetrical with respect to an axis of symmetry between the basic units U and parallel to the x direction.

According to an embodiment, adjacent basic units U, such as the four basic units U shown in FIG. 1, form a closed curve CL therebetween, and the closed curve CL defines a separation area V that is an empty space. The closed curve CL is formed of the edges of the plurality of island portions 101 and the edges of the plurality of the connectors 102. In addition, the separation area V is bordered by the closed curve CL.

According to an embodiment, each of the separation areas V penetrates upper and lower surfaces of the substrate 100. Each of the separation areas V separates the plurality of island portions 101, reduces the weight of the substrate 100, and improves the flexibility of the substrate 100. In addition, when an external force, such as bending or pulling, is applied to the substrate 100, the shapes of the separation areas V change. Accordingly, stress generated by deformation of the substrate 100 is easily reduced, thereby preventing abnormal deformation of the substrate 100 and improving durability. Accordingly, user convenience is improved when the display device 1 is used, and the display device 1 can be easily incorporated into a wearable device.

In an embodiment, an angle (e) between an edge of the island portion 101 and an edge of each connector 102 in one basic unit U is an acute angle. When an external force acts that pulls the substrate 100, as shown in FIG. 2, an angle θ', θ'>θ, between the edge of the island portion 101 and the edge of each connector 102 increases, the area or shape of a separation area V' changes, and a position of the island portion 101 also changes.

Figure 2:
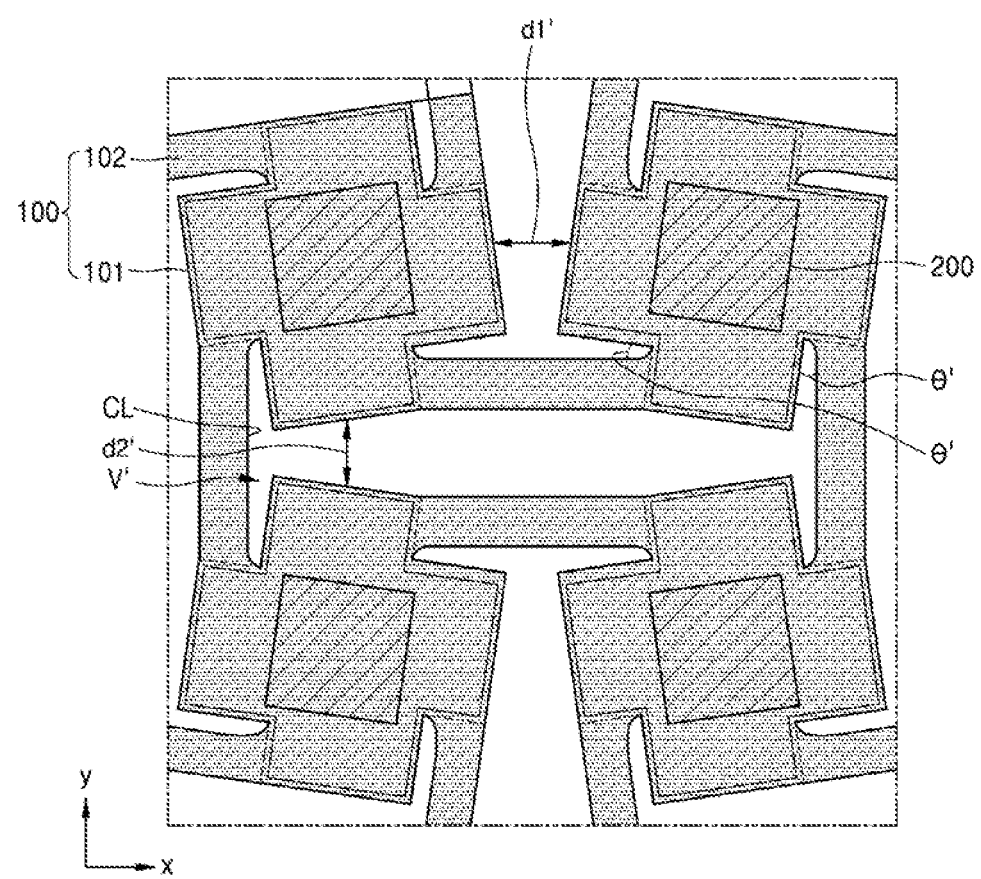
FIG. 2 is a plan view of a substrate stretched in a first direction and a second direction.

According to an embodiment, FIG. 2 is a plan view of the substrate 100 when stretched in a first direction and a second direction, and when the above-mentioned external force is applied, each of the island portions 101 rotates a certain angle due to the change in the above-mentioned angle θ' and increases the area of the separation area V', or deforming the shape. Due to the rotation of each of the island portions 101, intervals between the island portions 101, such as a first interval d1' and a second interval d2' are different at different positions.

According to an embodiment, when the external force acts to pull the substrate 100, since stress is concentrated on the connector 102 connected to the edge of the island portion 101, the closed curve CL around the separation area V is curved to prevent damage to the substrate 100.

Figure 3A:
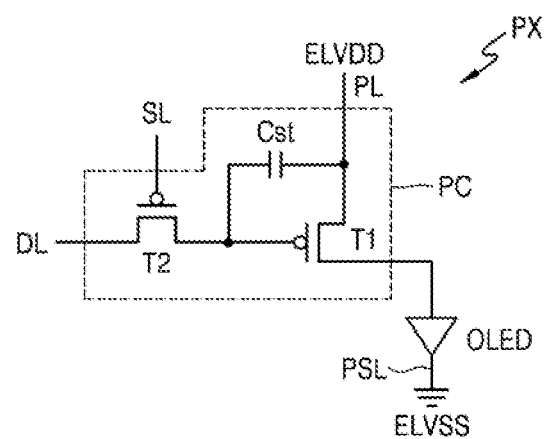
FIGS. 3A and 3B are equivalent circuit diagrams of one pixel included in a display device according to an embodiment.
Figure 3B:
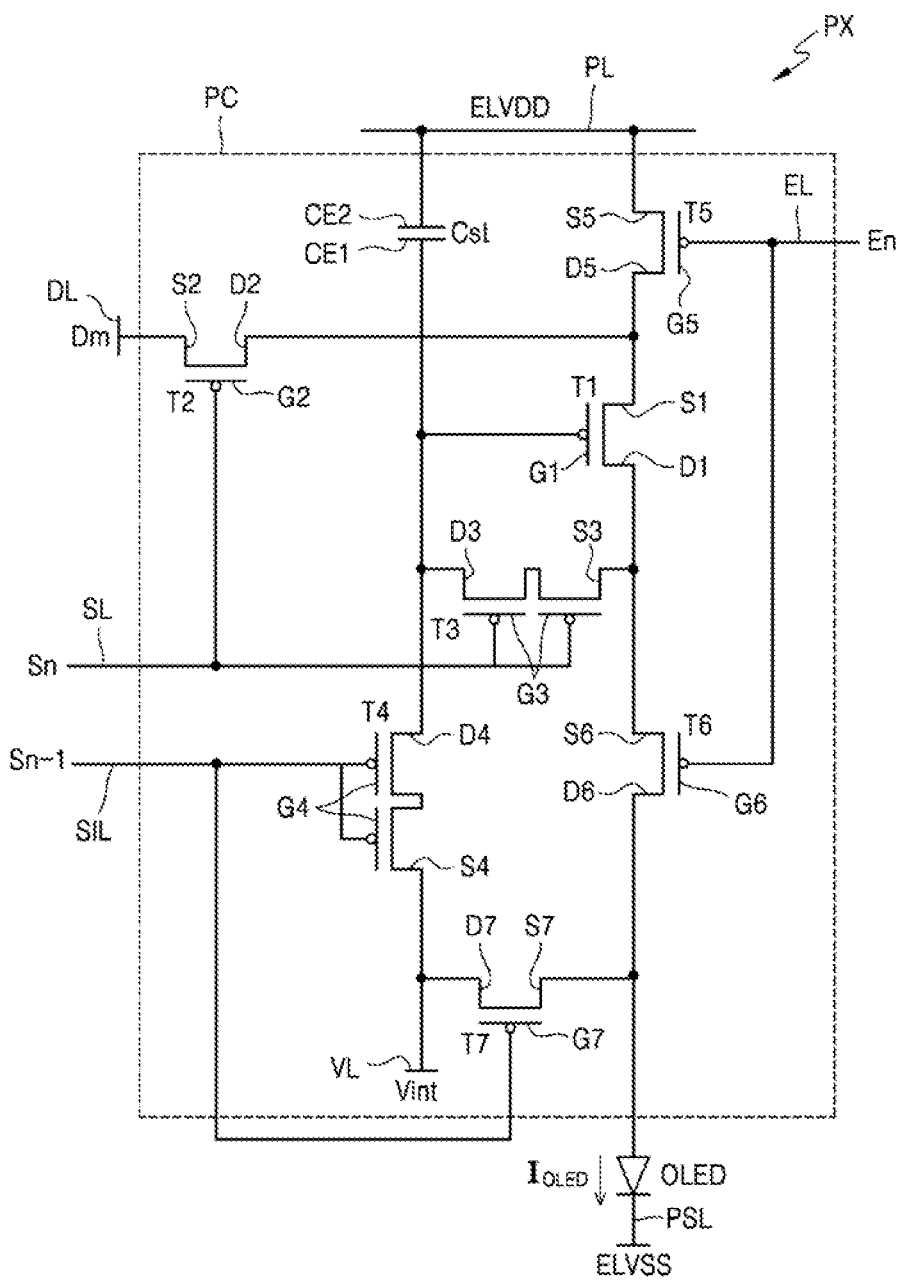

FIGS. 3A and 3B are equivalent circuit diagrams of one pixel in a display device according to an embodiment.

Referring to FIG. 3A, according to an embodiment, a pixel PX includes a pixel circuit PC and an organic light-emitting diode OLED as a display element connected to the pixel circuit PC.

According to an embodiment, the pixel circuit PC includes a driving thin-film transistor T1, a switching thin-film transistor T2, and a storage capacitor Cst. Each pixel PX emits, for example, one of red, green, or blue light from the organic light-emitting diode OLED. Alternatively, each pixel PX emits, for example, one of red, green, blue, or white light from the organic light-emitting diode OLED.

According to an embodiment, the switching thin-film transistor T2 is connected to a scan line SL and a data line DL and transmits a data voltage received from the data line DL to the driving thin-film transistor T1 based on a switching voltage received from the scan line SL. The storage capacitor Cst is connected to the switching thin-film transistor T2 and a driving voltage line PL and stores a voltage that corresponds to a difference between a voltage received from the second thin-film transistor T2 and a first power supply voltage ELVDD received from the driving voltage line PL.

According to an embodiment, the driving thin-film transistor T1 is connected to the driving voltage line PL and the storage capacitor Cst, and controls a driving current that corresponds to a voltage value stored in the storage capacitor Cst and that flows to the organic light-emitting diode OLED from the driving voltage line PL. The organic light-emitting diode OLED emits light whose luminance corresponds to the driving current. A common electrode, such as a cathode, of the organic light-emitting diode OLED receives a second power supply voltage ELVSS from a common voltage line PSL.

According to an embodiment, FIG. 3A illustrates that the pixel circuit PC includes two thin-film transistors and one storage capacitor, but embodiments are not limited thereto. The number of thin-film transistors and the number of storage capacitors can vary according to the design of the pixel circuit PC. For example, in other embodiments, the pixel circuit PC includes one or more thin-film transistors in addition to the aforementioned two thin-film transistors.

Referring to FIG. 3B, according to an embodiment, the pixel circuit PC includes a plurality of thin-film transistors and a storage capacitor. The thin-film transistors and the storage capacitor are connected to signal lines SL, SIL, EL, and DL, an initialization voltage line VL, and a driving voltage line PL.

In FIG. 3B, according to an embodiment, each pixel PX is connected to the signal lines SL, SIL, EL, and DL, the initialization voltage line VL, the common voltage line PSL, and the driving voltage line PL. However, in another embodiment, at least one of the signal lines SL, SIL, EL, and DL, the initialization voltage line VL, the common voltage line PSL, the driving voltage line PL, etc., is shared by neighboring pixels.

According to an embodiment, the plurality of thin-film transistors includes the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

According to an embodiment, the signal line includes the scan line SL that transmits a scan signal Sn, a previous scan line SIL that transmits a previous scan signal Sn−1 to a first initialization thin-film transistor T4 and a second initialization thin-film transistor T7, an emission control line EL that transmits an emission control signal En to an operation control thin-film transistor T5 and an emission control thin-film transistor T6, and the data line DL that transmits a data signal Dm to the driving thin-film transistor T1. The driving voltage line PL transmits the first power supply voltage ELVDD to the driving thin-film transistor T1, and the initialization voltage line VL transmits an initialization voltage Vint that initializes the driving thin-film transistor T1 and a pixel electrode of the organic light-emitting diode OLED.

According to an embodiment, a driving gate electrode G1 of the driving thin-film transistor T1 is connected to a lower electrode CE1 of the storage capacitor Cst, a driving source electrode S1 of the driving thin-film transistor T1 is connected to the driving voltage line PL via the operation control thin-film transistor T5, and a driving drain electrode D1 of the driving thin-film transistor T1 is electrically connected to a pixel electrode of the organic light-emitting diode OLED via the emission control thin-film transistor T6. The driving thin-film transistor T1 receives the data signal Dm according to a switching operation of the switching thin-film transistor T2 and supplies a driving current $I_{OLED}$ to the organic light-emitting diode OLED.

According to an embodiment, a switching gate electrode G2 of the switching thin-film transistor T2 is connected to the scan line SL, a switching source electrode S2 of the switching thin-film transistor T2 is connected to the data line DL, and a switching drain electrode D2 of the switching thin-film transistor T2 is connected to the driving source electrode S1 of the driving thin-film transistor T1 and connected to the driving voltage line PL through the operation control thin-film transistor T5. The switching thin-film transistor T2 is turned on in response to the scan signal Sn received through the scan line SL and performs a switching operation that transmits the data signal Dm received through the data line DL to the driving source electrode S1 of the driving thin-film transistor T1.

According to an embodiment, a compensation gate electrode G3 of the compensation thin-film transistor T3 is connected to the scan line SL, a compensation source electrode S3 of the compensation thin-film transistor T3 is connected to the driving drain electrode D1 of the driving thin-film transistor T1 and connected to the pixel electrode of the organic light-emitting element OLED through the emission control thin-film transistor T6, and a compensation drain electrode D3 of the compensation thin-film transistor T3 is connected to the lower electrode CE1 of the storage capacitor Cst, a first initialization drain electrode D4 of the first initialization thin-film transistor T4, and the driving gate electrode G1 of the driving thin-film transistor T1. The compensation thin-film transistor T3 is turned on in response to the scan signal Sn received through the scan line SL and electrically connects the driving gate electrode G1 to the driving drain electrode D1 of the driving thin-film transistor T1 to diode-connect the driving thin-film transistor T1.

According to an embodiment, a first initialization gate electrode G4 of the first initialization thin-film transistor T4 is connected to the previous scan line SIL, a first initialization source electrode S4 of the first initialization thin-film transistor T4 is connected to a second initialization drain electrode D7 of the second initialization thin-film transistor T7 and the initialization voltage line VL, and the first initialization drain electrode D4 of the first initialization thin-film transistor T4 is connected to the lower electrode CE1 of the storage capacitor Cst, the compensation drain electrode D3 of the compensation thin-film transistor T3, and the driving gate electrode G1 of the driving thin-film transistor T1. The first initialization thin-film transistor T4 is turned on in response to the previous scan signal Sn−1 received through the previous scan line SIL and initializes a voltage of the gate electrode G1 of the driving thin-film transistor T1 by transmitting the initialization voltage Vint to the gate electrode G1 of the driving thin-film transistor T1.

According to an embodiment, an operation control gate electrode G5 of the operation control thin-film transistor T5 is connected to the emission control line EL, an operation control source electrode S5 of the operation control thin-film transistor T5 is connected to the driving voltage line PL, and an operation control drain electrode D5 of the operation control thin-film transistor T5 is connected to the driving source electrode S1 of the driving thin-film transistor T1 and the switching drain electrode D2 of the switching thin-film transistor T2.

According to an embodiment, an emission control gate electrode G6 of the emission control thin-film transistor T6 is connected to the emission control line EL, an emission control source electrode S6 of the emission control thin-film transistor T6 is connected to the driving drain electrode D1 of the driving thin-film transistor T1 and the compensation source electrode S3 of the compensation thin-film transistor T3, and an emission control drain electrode D6 of the emission control thin-film transistor T6 is electrically connected to a second initialization source electrode S7 of the second initialization thin-film transistor T7 and the pixel electrode of the organic light-emitting diode OLED.

According to an embodiment, the operation control thin-film transistor T5 and the emission control thin-film transistor T6 are simultaneously turned on in response to the emission control signal En received through the emission control line EL so that the first power supply voltage ELVDD is transmitted to the organic light-emitting diode OLED and the driving current $I_{OLED}$ flows through the organic light-emitting diode OLED.

According to an embodiment, a second initialization gate electrode G7 of the second initialization thin-film transistor T7 is connected to the previous scan line SIL, the second initialization source electrode S7 of the second initialization thin-film transistor T7 is connected to the emission control drain electrode D6 of the emission control thin-film transistor T6 and the pixel electrode of the organic light-emitting diode OLED, and the second initialization drain electrode D7 of the second initialization thin-film transistor T7 is connected to the first initialization source electrode S4 of the first initialization thin-film transistor T4 and the initialization voltage line VL. The second initialization thin-film transistor T7 is turned on in response to the previous scan signal Sn−1 received through the previous scan line SIL to initialize the pixel electrode of the organic light-emitting diode OLED.

According to an embodiment, although FIG. 3B illustrates a case where the first initialization thin-film transistor T4 and the second initialization thin-film transistor T7 are connected to the same initialization voltage line VL, in another embodiment, the first initialization thin-film transistor T4 is connected to a first initialization voltage line and the second initialization thin-film transistor T7 is connected to a second initialization voltage line.

In addition, according to an embodiment, although FIG. 3B illustrates a case where the first initialization thin-film transistor T4 and the second initialization thin-film transistor T7 are connected to the previous scan line SIL, in another embodiment, the first initialization thin-film transistor T4 is connected to the previous scan line SIL and driven according to the previous scan signal Sn−1, and the second initialization thin-film transistor T7 is connected to a separate signal line, such as a next scan line, and driven according to a signal received through the signal line.

According to an embodiment, an upper electrode CE2 of the storage capacitor Cst is connected to the driving voltage line PL, and the opposite electrode of the organic light emitting diode OLED is connected to the common voltage line PSL to receive the second power supply voltage ELVSS. Accordingly, the organic light-emitting diode OLED receives the driving current $I_{OLED}$ from the driving thin-film transistor T1 and emit light to display an image.

According to an embodiment, FIG. 3B shows that the compensation thin-film transistor T3 and the first initialization thin-film transistor T4 have a dual gate electrode. However, in other embodiments, the compensation thin-film transistor T3 and the first initialization thin-film transistor T4 have one gate electrode.

Figure 4:
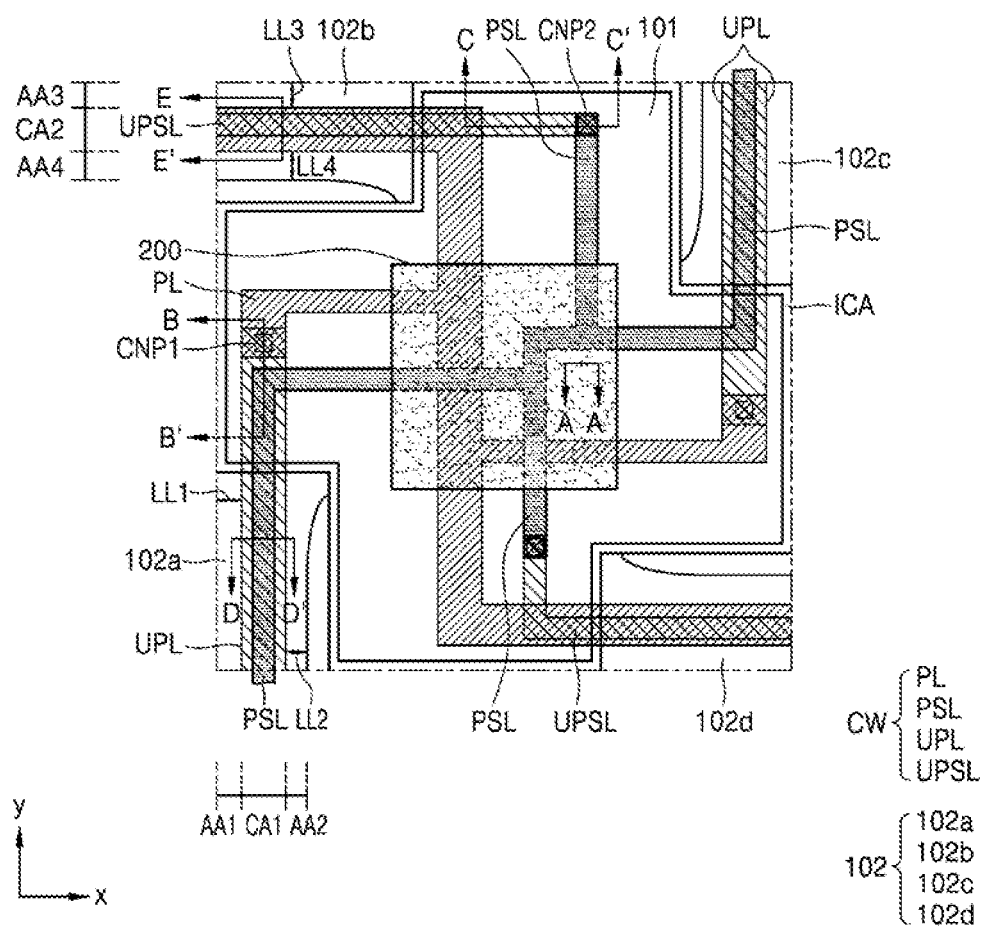
FIG. 4 is a plan view of a structure on a basic unit of a display device according to an embodiment.

FIG. 4 is a plan view of a structure on a basic unit of a display device according to an embodiment.

Referring to FIG. 4, a display device according to an embodiment includes a substrate that includes the island portion 101 and the connectors 102, the display unit 200 on the island portion 101, and connecting wires CW on the connectors 102. In a present embodiment, at least one of the connecting wires CW is provided on the same layer as a semiconductor layer of a thin-film transistor included in the display unit 200.

According to an embodiment, the display unit 200 includes a pixel area. The pixel includes at least one thin-film transistor and a display element that emits visible light connected to the at least one thin-film transistor. The light is emitted from the display element through a light-emitting area on a plane. For example, the display unit 200 includes a red light emitting area, a blue light emitting area, and a green light emitting area. The display unit 200 is disposed on the island portion 101 of the substrate. The display unit 200 is entirely surrounded by an inorganic contact area ICA, which will be described below.

According to an embodiment, the connecting wires CW are disposed on the connector 102 of the substrate. The connecting wires CW include the driving voltage line PL that transmits the first power voltage ELVDD to the display unit 200 and the common voltage line PSL that transmits the second power supply voltage ELVSS to the display unit 200. In addition, The connecting wires CW further include a lower driving voltage line UPL on a different layer from that of the driving voltage line PL and connected to the driving voltage line PL through a first contact portion CNP1, and a lower common voltage line UPSL on a different layer from that of the common voltage line PSL and connected to the common voltage line PSL through a second contact portion CNP2. In addition, the connecting wires CW further include signal lines such as data lines and scan lines.

According to an embodiment, the connector 102 includes a first connector 102a that extends in a first direction, such as a −y direction, from the island portion 101 and a second connector 102b extending in a second direction, such as an −x direction, from the island portion 101. In addition, the connectors 102 include a third connector 102c that extends in a direction parallel to the first direction from the island portion 101 and a fourth connector 102d that extends in a direction parallel to the second direction from the island portion 101.

In this case, according to an embodiment, the connecting wires CW connected to the display unit 200 include the first connector 102a to the fourth connector 102d.

According to an embodiment, the driving voltage line PL extends from the display unit 200 to the second connector 102b and the fourth connector 102d. In addition, the driving voltage line PL is connected to the lower driving voltage line UPL through the first contact portion CNP1 in the island portion 101. In this case, the lower driving voltage line UPL extends to the first connector 102a and the third connector 102c.

According to an embodiment, the common voltage line PSL extends from the display unit 200 to the first connector 102a and the third connector 102c. In addition, the common voltage line PSL is connected to the lower common voltage line UPSL through the second contact portion CNP2 in the island portion 101. The lower common voltage line UPSL extends to the second connector 102b and the fourth connector 102d.

According to an embodiment, the lower driving voltage line UPL is positioned in a first central area CA1 or a first adjacent area AA1 of the first connector 102a. The first connector 102a includes the first central area CA1, the first adjacent area AA1 adjacent to the first central area CA1, and a second adjacent area AA2 adjacent to the first central area CA1 and opposite to the first adjacent area AA1, where the first adjacent area AA1 is located farthest from the center of the island portion 101 of the areas adjacent to the first central area CA1. Moreover, the second adjacent area AA2 is located closest to the center of the island portion 101 of the areas adjacent to the first central area CA1. In this case, a width LL1 of the first adjacent area AA is less than a width LL2 of the second adjacent area AA2. The width LL2 of the second adjacent area AA2 is approximately 20% of a width of the first connector 102a. The first central area CA1 and the first adjacent area AA1 receive relatively less stress when the first connector 102a is tensioned to prevent cracking of the lower driving voltage line UPL in the first central area CA1 and the first adjacent area AA1.

According to an embodiment, the lower driving voltage line UPL extends from the first connector 102a in the island portion 101 and is connected to the driving voltage line PL through the first contact portion CNP1 in the island portion 101. The first contact portion CNP1 is formed at various positions in the island portion 101. The lower driving voltage line UPL extends in the first direction from the first connector 102a and connects to another adjacent island portion. Since the common voltage line PSL also extends in the first direction in the first connector 102a, the lower driving voltage line UPL overlaps the common voltage line PSL. In this case, the lower driving voltage line UPL is disposed on a different layer from that of the common voltage line PSL.

According to an embodiment, the lower common voltage line UPSL is positioned in a second central area CA2 or a third adjacent area AA3 of the second connector 102b. The second connector 102b includes the second central area CA2, the third adjacent area AA3 adjacent to the second central area CA2, and a fourth adjacent area AA4 adjacent to the second central area CA2 opposite to the third adjacent area AA3, where the third adjacent area AA3 is farthest from the center of the island portion 101 of the areas adjacent to the second central area CA2. Moreover, the fourth adjacent area AA4 is located closest to the center of the island portion 101 of the areas adjacent to the second central area CA2. In this case, a width LL3 of the third adjacent area AA3 is less than a width LL4 of the fourth adjacent area AA4. The width LL4 of the fourth adjacent area AA4 is approximately 20% of a width of the second connector 102b. The second central area CA2 and the third adjacent area AA3 receive relatively less stress when the second connector 102b is tensioned to prevent cracking of the lower common voltage line UPSL in the second central area CA2 and the third adjacent area AA3.

According to an embodiment, the lower common voltage line UPSL extends from the second connector 102b in the island portion 101 and is connected to the common voltage line PSL through the second contact portion CNP2 in the island portion 101. The second contact portion CNP2 to which the common voltage line PSL and the lower common voltage line UPSL are connected are located at various positions in the island portion 101, similar to the first contact portion CNP1 to which the driving voltage line PL and the lower driving voltage line UPL are connected. The lower common voltage line UPSL extends in the second direction, such as the −x direction, from the second connector 102b and connects to another adjacent island portion. Since the driving voltage line PL also extends in the second direction in the second connector 102b, the lower common voltage line UPSL overlaps the driving voltage line PL. In this case, the lower common voltage line UPSL and the driving voltage line PL are on different layers.

In FIG. 4, according to an embodiment, the driving voltage line PL is connected to the display unit 200 in the island portion 101, and the common voltage line PSL is also connected to the display unit 200 in the island portion 101. However, in another embodiment, the driving voltage line PL is connected to conductive patterns of layer above or below the layer where the driving voltage line PL is located, and the conductive patterns are connected to the display unit 200. That is, the driving voltage line PL is connected to the display unit 200 through conductive patterns located in other layers. Furthermore, in another embodiment, the common voltage line PSL is connected to the display unit 200 through conductive patterns in a layer above or below the layer where the common voltage line PSL is disposed through a contact hole in the island portion 101.

According to an embodiment, the connecting wires CW are located on the third connector 102c and the fourth connector 102d similar to the first connector 102a and the second connector 102b, respectively. In more detail, the lower driving voltage line UPL and the common voltage line PSL are located on the third connector 102c, similar to the first connector 102a. The driving voltage line PL and the lower common voltage line UPSL are located on the fourth connector 102d, similar to the second connector 102b. Since the configuration of the lower driving voltage line UPL and the common voltage line PSL in the third connector 102c is similar to the configuration of the lower driving voltage line UPL and the common voltage line PSL in the first connector 102a, and the configuration of the driving voltage line PL and the lower common voltage line UPSL in the fourth connector 102d is similar to the configuration of the driving voltage line PL and the lower common voltage line UPSL in the second connector 102b, a detailed description will be omitted herein.

In an embodiment, the island portion 101 is entirely surrounded by the inorganic contact area ICA. The inorganic contact area ICA is formed by directly contacting at least two layers that include an inorganic material, and prevents moisture from penetrating into display elements in each pixel. The inorganic contact area ICA extends along an edge of the island portion 101, and pixels are disposed in the inorganic contact area ICA.

As such, according to an embodiment, the driving voltage line PL and the lower driving voltage line UPL are disposed on the plurality of connectors 102, respectively. The driving voltage line PL and the lower driving voltage line UPL have a mesh structure and provide the first power supply voltage ELVDD to the display unit 200. In more detail, the driving voltage line PL and the lower driving voltage line UPL are directly or indirectly connected to a driving thin-film transistor and provide the first power supply voltage ELVDD. In addition, the common voltage line PSL and the lower common voltage line UPSL are disposed on the plurality of connection units 102, respectively. The common voltage line PSL and the lower common voltage line UPSL have a mesh structure and provide the second power supply voltage ELVSS to the display unit 200. In more detail, the common voltage line PSL and the lower common voltage line UPSL are directly or indirectly connected to an opposite electrode of the display element and provide the second power supply voltage ELVSS.

In a present embodiment, the lower driving voltage line UPL and the lower common voltage line UPSL are disposed on identical layers, and in particular, are disposed on the same layer as the semiconductor layer of the thin-film transistor. In addition, the lower driving voltage line UPL and the lower common voltage line UPSL include the same material as that of the semiconductor layer. This will be described in detail with reference to FIG. 5.

Figure 5:
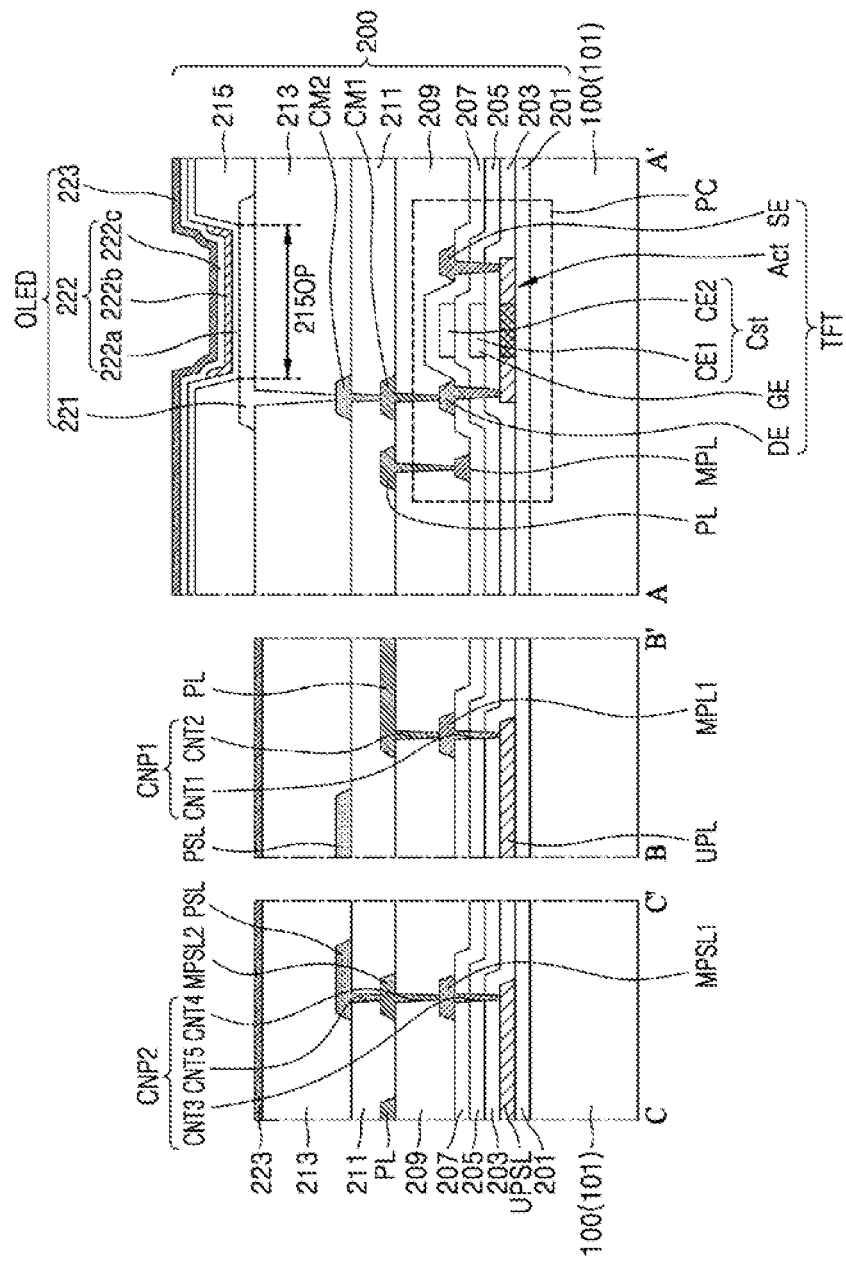
FIG. 5 is a cross-sectional view of a display device taken along line A-A', line B-B', and line C-C' of FIG. 4.

FIG. 5 is a cross-sectional view of the display device taken along line A-A', line B-B, and line C-C' of FIG. 4. In FIG. 5, the same reference numerals as used in FIG. 4 denote the same elements, and a duplicate description will not be given herein.

Referring to FIG. 5, according to an embodiment, the pixel circuit PC and the organic light-emitting diode OLED as a display element electrically connected to the pixel circuit PC are disposed on the island portion 101 of the substrate 100. The pixel circuit PC includes a thin-film transistor TFT and the storage capacitor Cst as described above with reference to FIG. 3A. The display unit 200 includes a buffer layer 201, a gate insulating layer 203, a first interlayer insulating layer 205, a second interlayer insulating layer 207, a first organic insulating layer 209, a second organic insulating layer 211, a third organic insulating layer 213, and a pixel-defining layer 215 that are sequentially stacked, and a first contact conductive pattern CM1 disposed on the first organic insulating layer 209 and a second contact conductive pattern CM2 disposed on the second organic insulating layer 211, which will be described below. The OLED includes a pixel electrode 221, an intermediate layer 222, and an opposite electrode 223, which will be described below.

According to an embodiment, a buffer layer 201 is disposed between the substrate 100 and the pixel circuit PC, and prevents impurities from penetrating into the thin-film transistor TFT. The buffer layer 201 includes an inorganic insulating material such as silicon nitride, silicon oxynitride, or silicon oxide, and may have a single layer or a multiple layer structure that includes the inorganic insulating materials described above.

According to an embodiment, the thin-film transistor TFT includes a semiconductor layer Act, a gate electrode GE, a source electrode SE, and a drain electrode DE. FIG. 5 shows a top gate type thin-film transistor in which the gate electrode GE is on the semiconductor layer Act with a gate insulating layer 203 therebetween. However, according to another embodiment, the thin-film transistor TFT is a bottom gate type.

According to an embodiment, the semiconductor layer Act includes polysilicon. Alternatively, in another embodiment, the semiconductor layer Act includes one or more of amorphous silicon, an oxide semiconductor, or an organic semiconductor, etc. The gate electrode GE includes a low resistance metal. The gate electrode GE includes a conductive material that includes molybdenum (Mo), aluminum (Al), copper (Cu), or titanium (Ti), etc. The gate electrode GE may have a single layer or a multiple layer structure that includes the aforementioned materials.

According to an embodiment, the gate insulating layer 203 is disposed on the buffer layer 201 between the semiconductor layer Act and the gate electrode GE and includes an inorganic insulating material such as silicon oxide, silicon nitride, silicon oxynitride, aluminum oxide, titanium oxide, tantalum oxide, or hafnium oxide, etc. The gate insulating layer 203 may have a single layer or a multiple layer structure that includes the aforementioned materials.

According to an embodiment, the source electrode SE and the drain electrode DE are disposed on the same layer, such as the second interlayer insulating layer 207, and include the same material. The source electrode SE and the drain electrode DE include a material having good conductivity. The source electrode SE and the drain electrode DE include a conductive material such as Mo, Al, Cu, or Ti, etc, and may be formed as a single layer or a multiple layer structure that includes the aforementioned materials. In an embodiment, the source electrode SE and the drain electrode DE have a multiple layer structure that includes a Ti layer, an Al layer, and a Ti layer (Ti/Al/Ti).

According to an embodiment, the storage capacitor Cst includes a lower electrode CE1 and an upper electrode CE2 which overlap each other with a first interlayer insulating layer 205 therebetween. The storage capacitor Cst overlaps the thin-film transistor TFT. In this regard, FIG. 5 shows that the gate electrode GE of the thin-film transistor TFT is the lower electrode CE1 of the storage capacitor Cst. In another embodiment, the storage capacitor Cst does not overlap the thin-film transistor TFT. The storage capacitor Cst is covered with the second interlayer insulating layer 207. An upper electrode CE2 of the storage capacitor Cst includes a conductive material such as Mo, Al, Cu, or Ti, etc. The upper electrode CE2 of the storage capacitor Cst may have a single layer or a multiple layer structure that includes the aforementioned materials.

According to an embodiment, the first interlayer insulating layer 205 and the second interlayer insulating layer 207 each includes an inorganic insulating material such as silicon oxide, silicon nitride, or silicon oxynitride. The first interlayer insulating layer 205 and the second interlayer insulating layer 207 may have a single layer or a multiple layer structure that includes the aforementioned materials.

According to an embodiment, the second interlayer insulating layer 207, the thin-film transistor TFT and the storage capacitor Cst are covered with the first organic insulating layer 209.

According to an embodiment, the driving voltage line PL is disposed on the first organic insulating layer 209. The driving voltage line PL is connected through a contact hole that penetrates the first organic insulating layer 209 to an intermediate driving voltage line MPL located on the same layer as the source electrode SE and the drain electrode DE. When the driving voltage line PL and the intermediate driving voltage line MPL are provided in a display unit with multiple structures connected to each other with an insulating layer therebetween, a resistance increase in the driving voltage line PL can be prevented and a width of the driving voltage line PL can be reduced. In another embodiment, one of the driving voltage line PL or the intermediate driving voltage line MPL are included.

According to an embodiment, the second organic insulating layer 211 and the third organic insulating layer 213 are sequentially disposed on the first organic insulating layer 209. The first organic insulating layer 209, the second organic insulating layer 211, and the third organic insulating layer 213 each include an organic insulating material. The organic insulating material includes a general polymer such as polymethylmethacrylate (PMMA) or polystyrene (PS), a polymer derivative that includes a phenolic group, an acrylic polymer, an imide polymer, an aryl ether polymer, an amide polymer, a fluorine-based polymer, a p-xylene-based polymer, a vinyl alcohol polymer, or a blend thereof.

According to an embodiment, a pixel electrode 221 is disposed on the second organic insulating layer 211. In some embodiments, an inorganic insulating layer is disposed on the third organic insulating layer 213, and the pixel electrode 221 is disposed on the inorganic insulating layer.

According to an embodiment, the pixel electrode 221 is electrically connected to the thin-film transistor TFT of the pixel circuit PC. In this regard, FIG. 5 illustrates that the thin-film transistor TFT and the pixel electrode 221 are electrically connected to each other through the first contact conductive pattern CM1 disposed on the first organic insulating layer 209 and the second contact conductive pattern CM2 disposed on the second organic insulating layer 211.

According to an embodiment, the pixel electrode 221 includes a transparent conductive oxide such as indium tin oxide (ITO), indium zinc oxide (IZO), zinc oxide (ZnO), indium oxide (In2O3), indium gallium oxide (IGO), or aluminum zinc oxide (AZO). In another embodiment, the pixel electrode 221 includes a reflective layer that includes one of Ag, Mg, Al, Pt, Pd, Au, Ni, Nd, Ir, or Cr, or a compound thereof. In another embodiment, the pixel electrode 221 further includes a film formed of ITO, IZO, ZnO, or $In_2O_3$ above or below the aforementioned reflective layer. For example, the pixel electrode 221 may have a three-layer structure in which an ITO layer, a silver (Ag) layer, and an ITO layer are stacked.

According to an embodiment, the pixel-defining layer 215 covers an edge of the pixel electrode 221 and includes an opening 2150P that exposes a center portion of the pixel electrode 221. The opening 2150P of the pixel electrode 221 defines a light-emitting area.

According to an embodiment, the pixel-defining layer 215 includes an organic insulating material such as polyimide. Alternatively, in another embodiment, the pixel-defining layer 215 includes an inorganic insulating material. Alternatively, in yet another embodiment, the pixel defining layer 215 includes an organic insulating material and an inorganic insulating material.

According to an embodiment, an intermediate layer 222 is disposed on the pixel-defining layer 215. The intermediate layer 222 includes a light-emitting layer 222b. The light-emitting layer 222b includes an organic light-emitting material such as a polymer organic material or a low-molecular weight organic material that emits light of a predetermined color. Alternatively, in other embodiments, the light-emitting layer 222b includes an inorganic light-emitting material or may include quantum dots.

According to an embodiment, a first functional layer 222a and a second functional layer 222c are disposed below and above the light emitting layer 222b, respectively.

According to an embodiment, the first functional layer 222a may include a single layer or multiple layers. For example, in some embodiments, the first functional layer 222a is a single layered hole transport layer HTL, and includes poly-(3,4)-ethylene-dihydroxythiophene (PEDOT) or polyaniline (PANI). Alternatively, in other embodiments, the first functional layer 123 includes a hole injection layer HIL and a hole transport layer HTL According to an embodiment, the second functional layer 222c may include a single layer or multiple layers. The second functional layer 222c includes one or more of an electron transport layer (ETL) or an electron injection layer (EIL).

According to an embodiment, FIG. 5 illustrates that the intermediate layer 222 includes both the first functional layer 222a and the second functional layer 222c. However, in another embodiment, the intermediate layer 222 optionally includes the first functional layer 222a and the second functional layer 222c. For example, the intermediate layer 222 does not include the second functional layer 222c.

According to an embodiment, the light emitting layer 222b of the intermediate layer 222 is disposed for each pixel, whereas the first functional layer 222a and the second functional layer 222c are formed as a single body to cover a plurality of pixels.

According to an embodiment, the opposite electrode 223 includes a conductive material that has a low work function. For example, the opposite electrode 223 includes a (semi) transparent layer such as Ag, Mg, Al, Pt, Pd, Au, Ni, Nd, Ir, Cr, lithium (Li), or calcium (Ca), or an alloy thereof. Alternatively, in another embodiment, the opposite electrode 223 further includes a layer such as ITO, IZO, ZnO, or $In_2O_3$ on the (semi) transparent layer that includes the aforementioned material. The opposite electrode 223 is formed as a single body to cover a plurality of pixels. For example, the opposite electrode 223 entirely covers the island portion 101 of the substrate 100. The area of the opposite electrode 223 differs from the areas of the first functional layer 222a and the second functional layer 222c described above.

According to an embodiment, an upper portion of the opposite electrode 223 is covered with an encapsulation layer. The encapsulation layer includes at least one inorganic encapsulation layer, at least one organic encapsulation layer, or a combination thereof. In an embodiment, the encapsulation layer includes a first inorganic encapsulation layer, an organic encapsulation layer, and a second inorganic encapsulation layer that are sequentially stacked.

According to an embodiment, each of the first inorganic encapsulation layer and the second inorganic encapsulation layer includes one or more inorganic insulating materials. The inorganic insulating material includes aluminum oxide, tantalum oxide, hafnium oxide, zinc oxide, silicon oxide, silicon nitride, or silicon oxynitride. The organic encapsulation layer includes a polymer-based material. Examples of a polymer-based material include an acrylic resin, an epoxy resin, polyimide, or polyethylene. The acrylic resin includes, for example, polymethyl methacrylate or polyacrylic acid, etc.

According to an embodiment, the organic encapsulation layer is disposed only on the island portion 101 of the substrate 100. Accordingly, the display device 1 described with reference to FIGS. 1 and 2 includes the organic encapsulation layer on the island portion 101 apart from rest of the display device 1.

In a present embodiment, the lower driving voltage line UPL is disposed on the same layer as the semiconductor layer Act. The driving voltage line PL is disposed on the first organic insulating layer 209 and is covered by the second organic insulating layer 211. The common voltage line PSL is disposed on the second organic insulating layer 211, and the third organic insulating layer 213 covers the common voltage line PSL. At least one of the first functional layer 222a, the second functional layer 222c, and the opposite electrode 223 are on the third organic insulating layer 213. In FIG. 5, the opposite electrode 223 is shown.

In a present embodiment, the lower driving voltage line UPL is connected to the driving voltage line PL through the first contact portion CNP1. In this case, the first contact portion CNP1 includes a first contact hole CNT1 and a second contact hole CNT2. The first contact hole CNT1 penetrates the gate insulating layer 203, the first interlayer insulating layer 205, and the second interlayer insulating layer 207, and the second contact hole CNT2 may be provided in the first organic insulating layer 209.

In more detail, according to an embodiment, the lower driving voltage line UPL is connected to the driving voltage line PL through a connection conductive pattern MPL1 located on the same layer as the source electrode SE or the drain electrode DE. The connection conductive pattern MPL1 is connected to the lower driving voltage line UPL through the first contact hole CNT1. In this case, the connection conductive pattern MPL1 includes the same material as the source electrode SE or the drain electrode DE. In addition, the driving voltage line PL is connected to the connection conductive pattern MPL1 through the second contact hole CNT2. In this case, the first contact hole CNT1 and the second contact hole CNT2 overlap each other. In some embodiments, the first contact hole CNT1 and the second contact hole CNT2 are spaced apart from each other.

Therefore, according to an embodiment, the first power supply voltage ELVDD (see FIG. 3A) is supplied to the driving voltage line PL through the lower driving voltage line UPL or to the lower driving voltage line UPL through the driving voltage line PL.

In a present embodiment, the lower common voltage line UPSL is disposed on the same layer as the semiconductor layer Act. The common voltage line PSL is disposed on the second organic insulating layer 211 and is covered by the third organic insulating layer 213. In this case, the lower common voltage line UPSL is connected to the common voltage line PSL through a first connection pattern MPSL1 on the second interlayer insulating layer 207 and a second connection pattern MPSL2 on the first organic insulating layer 209.

In addition, according to an embodiment, the lower common voltage line UPSL and the common voltage line PSL are connected to each other through the second contact portion CNP2. In this case, the second contact portion CNP2 includes a third contact hole CNT3, a fourth contact hole CNT4, and a fifth contact hole CNT5. The third contact hole CNT3 penetrates the gate insulating layer 203, the first interlayer insulating layer 205, and the second interlayer insulating layer 207. The fourth contact hole CNT4 penetrates the first organic insulating layer 209. The fifth contact hole CNT5 penetrates in the second organic insulating layer 211.

In more detail, according to an embodiment, the first connection pattern MPSL1 is connected to the lower common voltage line UPSL through the third contact hole CNT3. The second connection pattern MPSL2 is connected to the first connection pattern MPSL1 through the fourth contact hole CNT4. In addition, the common voltage line PSL is connected to the second connection pattern MPSL2 through the fifth contact hole CNT5. In this case, the first connection pattern MPSL1 includes the same material as the source electrode SE or the drain electrode DE, and the second connection pattern MPSL2 includes the same material as the driving voltage line PL.

In this case, according to an embodiment, the third contact hole CNT3, the fourth contact hole CNT4, and the fifth contact hole CNT5 overlap each other. In another embodiment, at least some of the third contact hole CNT3, the fourth contact hole CNT4, and the fifth contact hole CNT5 are spaced apart from each other in a direction parallel to an upper surface of a substrate.

According to an embodiment, the second power voltage ELVSS (see FIG. 3A) is supplied to the common voltage line PSL through the lower common voltage line UPSL or to the lower common voltage line UPSL through the common voltage line PSL. The common voltage line PSL is in contact with the opposite electrode 223. In this case, the common voltage line PSL is electrically connected to the opposite electrode 223. Accordingly, the second power supply voltage ELVSS (see FIG. 3A) is supplied to the opposite electrode 223.

In a present embodiment, the lower driving voltage line UPL and the lower common voltage line UPSL include the same material as the semiconductor layer Act. In this case, after forming a preliminary semiconductor pattern, the preliminary semiconductor pattern is doped to form the lower driving voltage line UPL and the lower common voltage line UPSL. When the semiconductor layer Act is formed, both sides of an area, hereinafter referred to as a channel area, that overlaps the lower electrode CE1 is doped using the lower electrode CE1 as a mask. However, since the lower electrode CE1 is not located on the lower driving voltage line UPL and the lower common voltage line UPSL, the lower driving voltage line UPL and the lower common voltage line UPSL are entirely doped and used as a connecting wire.

Figure 6:
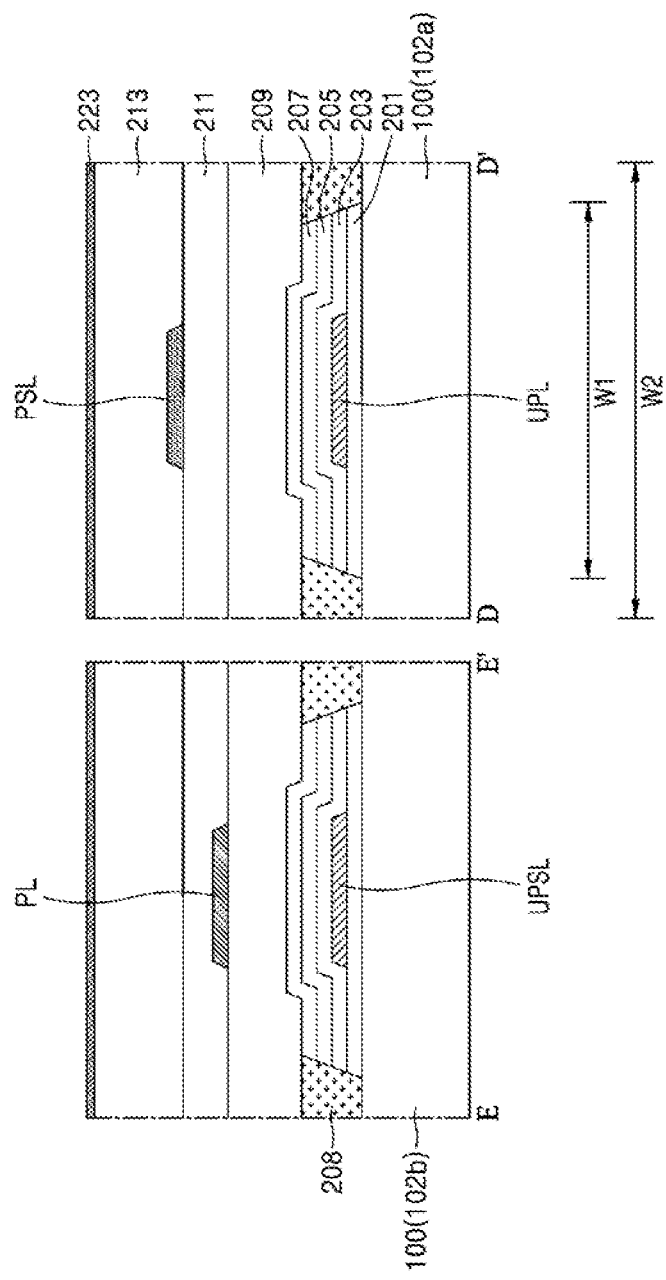
FIG. 6 is a cross-sectional view of a display device taken along line D-D' and line E-E' of FIG. 4.

FIG. 6 is a cross-sectional view of the display device taken along line D-D' and line E-E' of FIG. 4. In FIG. 6, the same reference numerals as used in FIG. 5 denote the same elements, and a duplicate description will be omitted.

Referring to FIG. 6, according to an embodiment, the lower driving voltage line UPL is disposed on the first connector 102a, and the common voltage line PSL disposed on the lower driving voltage line UPL. The lower driving voltage line UPL is disposed on the same layer as a semiconductor layer of a thin-film transistor.

In a present embodiment, the lower driving voltage line UPL and the common voltage line PSL overlap each other. In more detail, the lower driving voltage line UPL and the common voltage line PSL overlap each other to be substantially aligned with each other. Therefore, a width of the first connector 102a may be minimized.

In a present embodiment, the buffer layer 201, the gate insulating layer 203, the first interlayer insulating layer 205, and the second interlayer insulating layer 207 are disposed on the first connector 102a. In this case, the lower driving voltage line UPL is interposed between the buffer layer 201 and the gate insulating layer 203. In some embodiments, at least some of the buffer layer 201, the gate insulating layer 203, the first interlayer insulating layer 205, and the second interlayer insulating layer 207 can be omitted. Hereinafter, an embodiment in which all of the buffer layer 201, the gate insulating layer 203, the first interlayer insulating layer 205, and the second interlayer insulating layer 207 are disposed on the first connectors 102a will be mainly described in detail.

In a present embodiment, the inorganic insulating layers, that is, the buffer layer 201, the gate insulating layer 203, the first interlayer insulating layer 205, and the second interlayer insulating layer 207, are disposed on a portion of the first connectors 102a, and a lower organic insulating layer 208 is disposed on the other portion of the first connector 102a. In other words, a width W1 of an inorganic insulating layer disposed on the first connector 102a is less than a width W2 of the first connector 102a.

In this case, according to an embodiment, edges of the buffer layer 201, the gate insulating layer 203, the first interlayer insulating layer 205, and the second interlayer insulating layer 207 are covered by the lower organic insulating layer 208. For example, the lower organic insulating layer 208 covers the edges of the buffer layer 201, the gate insulating layer 203, the first interlayer insulating layer 205, and the second interlayer insulating layer 207, which are aligned with each other and form an oblique angle with the upper surface of the first connector 102a and the second connector 102b. In addition, the gate insulating layer 203, the first interlayer insulating layer 205, and the second interlayer insulating layer 207 have a step with respect to the upper surface of the first connector 102a and second connector 102b where they overlap the lower driving voltage line UPL and the lower common voltage line UPSL, respectively. The lower organic insulating layer 208 relieves stress at the edge of the first connector 102a, for example, near the edge of the first connector 102a. The lower organic insulating layer 208 includes an organic insulating material such as polyimide.

According to an embodiment, the first organic insulating layer 209 and the second organic insulating layer 211 cover the second interlayer insulating layer 207 and the lower organic insulating layer 208. The common voltage line PSL is disposed on the second organic insulating layer 211, and the third organic insulating layer 213 covers the common voltage line PSL. The opposite electrode 223 is disposed on the third organic insulating layer 213.

In a present embodiment, the lower common voltage line UPSL is disposed on the second connector 102b, and the driving voltage line PL is disposed on the lower common voltage line UPSL. In this case, the lower common voltage line UPSL is located on the same layer as the semiconductor layer of the thin-film transistor. In particular, the lower common voltage line UPSL is located on the same layer as that of the lower driving voltage line UPL.

In a present embodiment, the lower common voltage line UPSL and the driving voltage line PL overlap each other. In more detail, the lower common voltage line UPSL and the driving voltage line PL overlap each other to be substantially aligned with each other. Therefore, the width of the second connector 102b can be minimized.

In a present embodiment, the buffer layer 201, the gate insulating layer 203, the first interlayer insulating layer 205, the second interlayer insulating layer 207, and the lower organic insulating layer 208 are disposed on the second connector 102b similarly to the first connector 102a. In this case, the lower common voltage line UPSL is interposed between the buffer layer 201 and the gate insulating layer 203.

According to an embodiment, the first organic insulating layer 209 and the second organic insulating layer 211 are disposed on the second connector 102b and cover the second interlayer insulating layer 207 and the lower organic insulating layer 208. In this case, the driving voltage line PL is disposed on the first organic insulating layer 209. In more detail, the driving voltage line PL is interposed between the first organic insulating layer 209 and the second organic insulating layer 211. Therefore, the driving voltage line PL and the common voltage line PSL are located on different layers.

In a present embodiment, the lower driving voltage line UPL and the lower common voltage line UPSL are located on the same layer as the semiconductor layer of the thin-film transistor. In this case, a wire other than the driving voltage line PL can be additionally disposed between the first organic insulating layer 209 and the second organic insulating layer 211 on the first connector 102a. In addition, a wire other than the common voltage line PSL can be additionally disposed between the second organic insulating layer 211 and the third organic insulating layer 213 on the second connector 102b. Therefore, even if additional connecting wires are required for the display device, an increase in the widths of the first connector 102a and the second connector 102b can be minimized. Accordingly, the area of an island portion can be increased, and the resolution of the display device can be increased.

Figure 7:
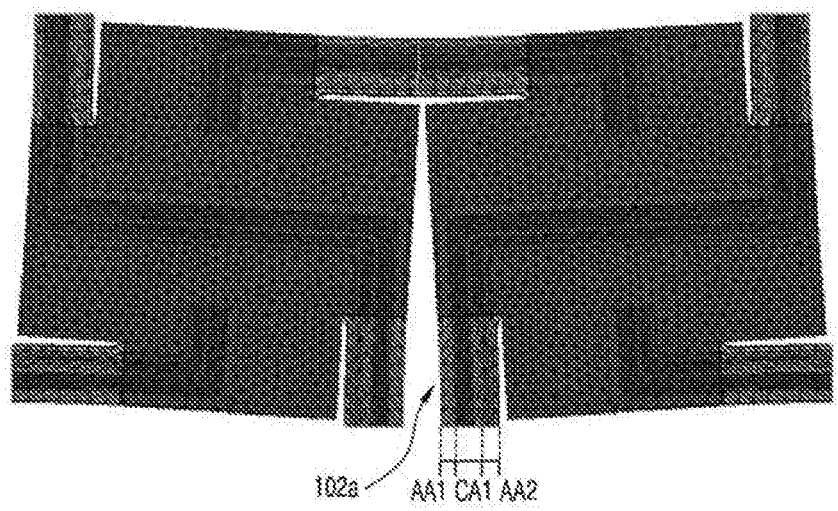
FIG. 7 illustrates a simulation result of a stress distribution when an external force is applied that pulls a substrate

FIG. 7 illustrates a simulation result of a stress distribution when an external force is applied that pulls a substrate.

Referring to FIG. 7, according to an embodiment, when an external force pulls the substrate, an island portion of the substrate is subjected to relatively little stress, while a relatively large stress acts on a connector that extends from the island portion of the substrate.

In particular, according to an embodiment, referring to FIGS. 4 and 7, the first connector 102a extending in a first direction includes the first central area CA1, the first adjacent area AA1 that is farthest from the center of the island portion 101, and the second adjacent area AA2 that is closest to the center of the island portion 101. In this case, it can be seen from a simulation result that the stress acts more on the second adjacent area AA2 of the first connectors 102a than on the first central area CA1 or the first adjacent area A.

Therefore, according to an embodiment, when the lower driving voltage line UPL or the lower common voltage line UPSL is disposed on the first central area CA1 or the first adjacent area A of the first connector 102a, the occurrence of cracks, etc., due to the stress can be prevented.

Figure 8:
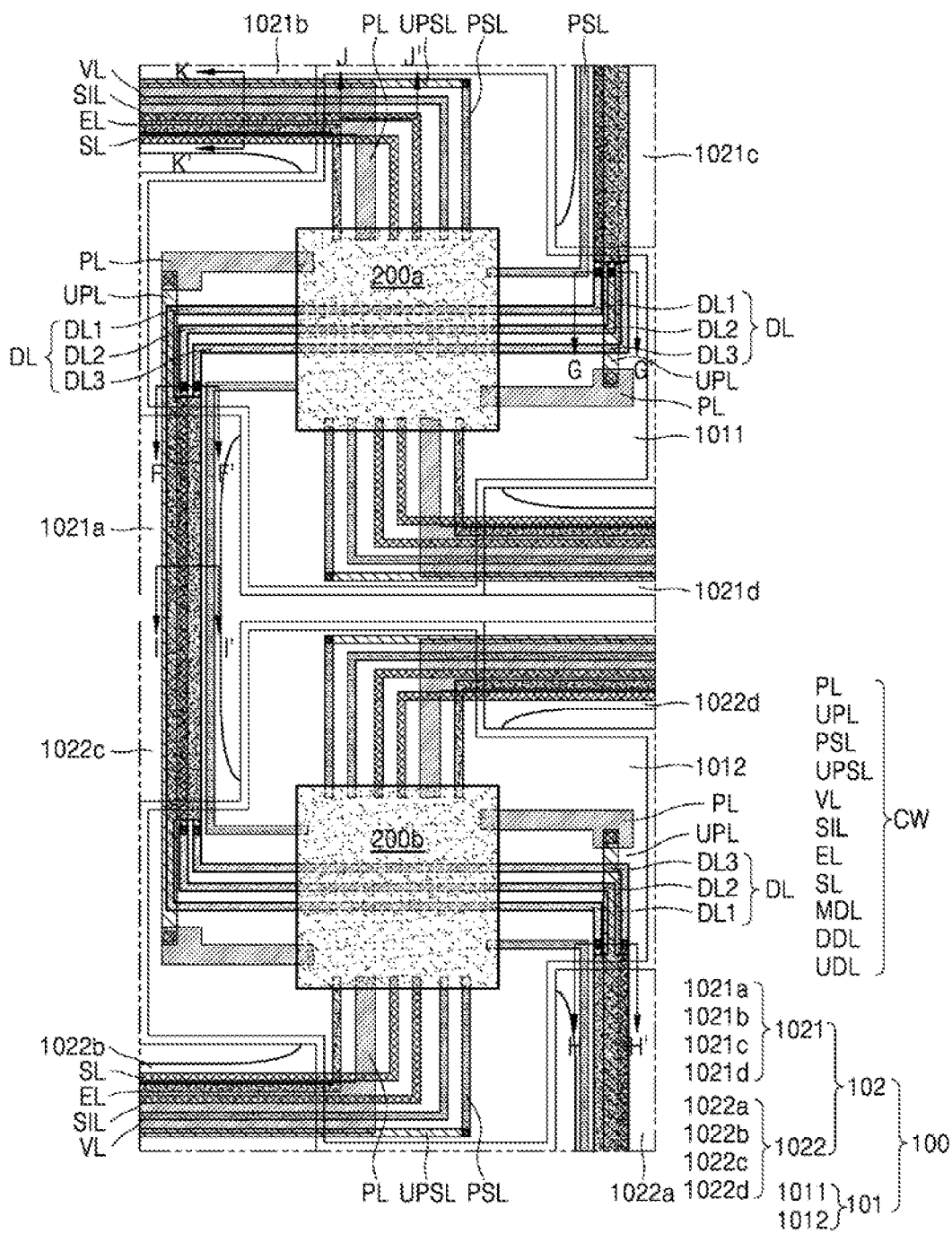
FIG. 8 is a plan view of a structure on a basic unit of a display device according to an embodiment.
Figure 9:
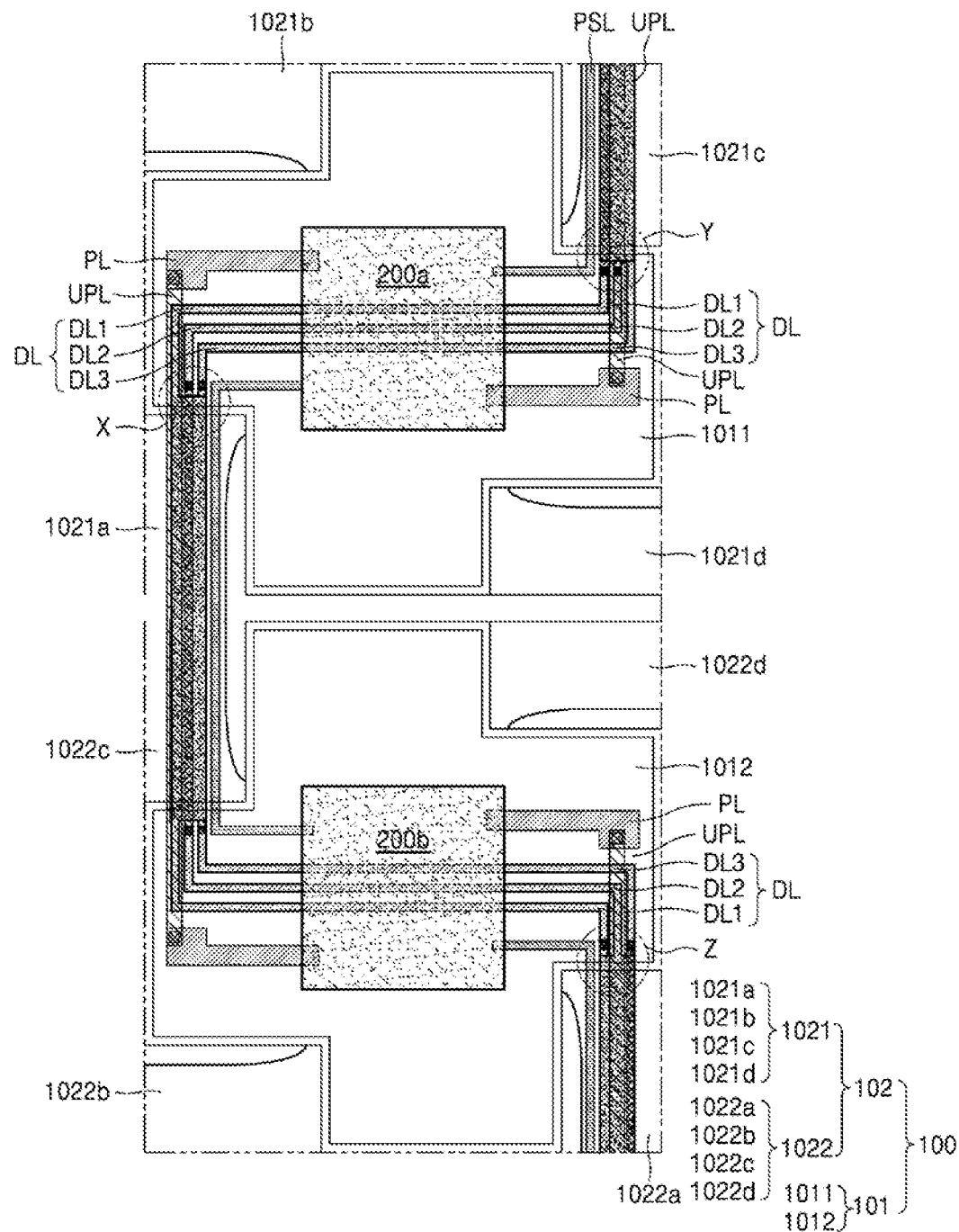
FIG. 9 is a plan view of some wires in a structure on a basic unit of a display device according to an embodiment.
Figure 10A:
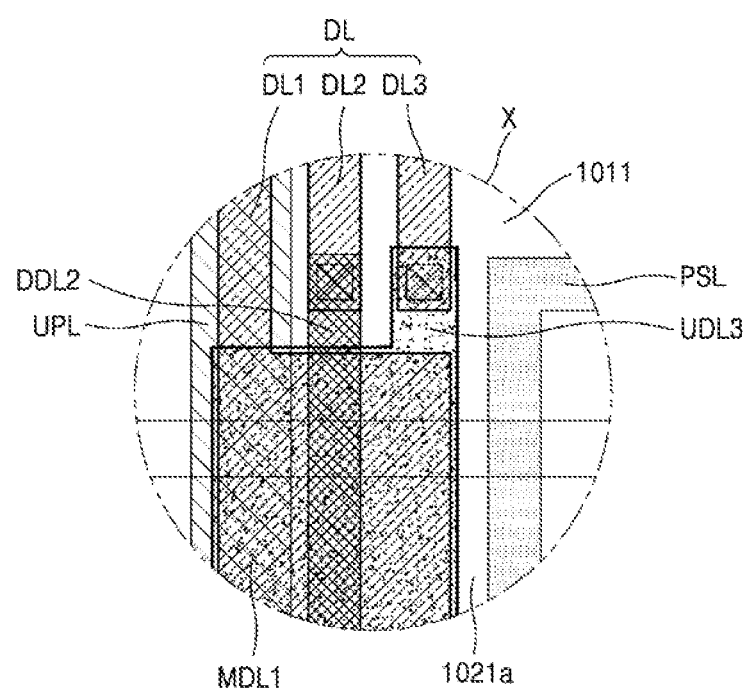
FIG. 10A is an enlarged view of portion X in FIG. 9.

FIG. 8 is a plan view of a structure on a basic unit of a display device according to an embodiment. FIG. 9 is a plan view of some wires in a structure on a basic unit of a display device according to an embodiment. FIG. 10A is an enlarged view of region X in FIG. 9, FIG. 108 is an enlarged view of region Y in FIG. 9, and FIG. 10C is an enlarged view of region Z in FIG. 9.

In FIGS. 8, 9, and 10A to 10C, the same reference numerals as used in FIG. 4 denote the same elements, and a duplicate description will be omitted herein.

Referring to FIGS. 8 and 9, a display device according to an embodiment includes the substrate 100 with the island portion 101 and the connectors 102, display units 200a and 200b on the island portion 101, and the connecting wires CW on the connectors 102. In a present embodiment, at least one of the connecting wires CW is located on the same layer as a semiconductor layer of a thin-film transistor included in the display units 200a and 200b.

According to an embodiment, display units 200a and 200b include a first display unit 200a and a second display unit 200b. The first display unit 200a and the second display unit 200b define pixel areas, respectively. The pixel area includes at least one thin-film transistor and a display element that emits visible light connected to the at least one thin-film transistor.

According to an embodiment, the substrate 100 includes a first island portion 1011 and a second island portion 1012 adjacent to the first island portion 1011. The first display unit 200a is disposed on the first island portion 1011 of the substrate 100, and the second display unit 200b is disposed on the second island portion 1012.

According to an embodiment, the substrate 100 includes first to fourth connectors 1021*a* to *r* 1021*d* that extend from the first island portion 1011. In this case, the connecting wires CW connected to the first display unit 200*a* are disposed on the first to fourth connectors 1021*a* to 1021*d* of the first island portion 1011.

In addition, according to an embodiment, the substrate 100 includes first to fourth connectors 1022*a* to 1022*d* that extend from the second island portion 1012. In this case, the connecting wires CW connected to the second display unit 200*b* are disposed on the first to fourth connectors 1022*a* to 1022*d* of the second island portion 1012.

In a present embodiment, the first connector 1021*a* of the first island portion 1011 and the third connector 1022*c* of the second island portion 1012 extend to be connected to each other. In this case, the first connector 1021*a* of the first island portion and the third connector 1022*c* of the second island portion 1012 are integrally provided. Therefore, the connecting wires in the first connector 1021*a* extend in the first direction to the third connector 1022*c* of the second island portion. In addition, the connecting wires extend to the second island portion 1012 and are connected to the second display unit 200*b*. As described above, wires located on a connector 1021 of the first island portion 1011 extend to be connected to an adjacent island portion.

According to an embodiment, since the first island portion 1011 and the connector 1021 of the first island portion are similar to the second island portion 1012 and a connector 1022 of the second island portion, the first island portion 1011 and the connector 1021 of the first island portion will be mainly described below in detail.

According to an embodiment, the first connector 1021*a* of the first island portion and a third connector 1021*c* of the first island portion include the lower driving voltage line UPL, the common voltage line PSL, and the conductive patterns MDL, UDL, and DDL connected to the data lines DL, respectively. The lower driving voltage line UPL, the common voltage line PSL, and the conductive patterns MDL, UDL, and DDL extend in the first direction.

In a present embodiment, the first island portion 1011 includes the data line DL connected to a thin-film transistor of the first display unit 200*a*. In this case, the data line DL includes a first data line DL1, a second data line DL2, and a third data line DL3 that are spaced apart from each other. In an embodiment, the first data line DL1, the second data line DL2, and the third data line DL3 are located on an identical layer. In an embodiment, the first data line DL1, the second data line DL2, and the third data line DL3 transmit data signals to a red pixel, a green pixel, and a blue pixel, respectively.

According to an embodiment, at least one of the first data line DL1, the second data line DL2, and the third data line DL3 is connected to a conductive pattern on another layer on the connectors 102.

In more detail, according to an embodiment, referring to FIGS. 9 and 10A, in the first connector 1021*a* of the first island portion, the connecting wires CW include a first intermediate conductive pattern MDL1, a second lower conductive pattern DDL2 under the first intermediate conductive pattern MDL1, and a third upper conductive pattern UDL3 on the first intermediate conductive pattern MDL1, where the first intermediate conductive pattern MDL1, the second lower conductive pattern DDL2, and the third upper conductive pattern UDL3 are connected to the first data line DL1, the second data line DL2, and the third data line DL3, respectively.

According to an embodiment, the first intermediate conductive pattern MDL1 is disposed on the same layer as that of the first data line DL1. In this case, the first intermediate conductive pattern MDL1 is integrally formed with the first data line DL1. The second lower conductive pattern DDL2 is connected to the second data line DL2 in the first island portion 1011. In more detail, the second lower conductive pattern DDL2 is connected to the second data line DL2 through contact holes that penetrate the insulating layers. The third upper conductive pattern UDL3 is connected to the third data line DL3 in the first island portion 1011. In more detail, the third upper conductive pattern UDL3 is connected to the third data line DL3 through a contact hole that penetrates first organic insulating layer 209.

In a present embodiment, in the first connector 1021*a* of the first island portion, a width of the first intermediate conductive pattern MDL1 is greater than a width of the first data line DL1. In this case, the first intermediate conductive pattern MDL1 overlaps the second lower conductive pattern DDL2 and the third upper conductive pattern UDL3. In the first connector 1021*a* of the first island portion, a width of the third upper conductive pattern UDL3 is greater than a width of the third data line DL3. In this case, the third upper conductive pattern UDL3 overlaps the first intermediate conductive pattern MDL1 and the second lower conductive pattern DDL2.

Figure 10B:
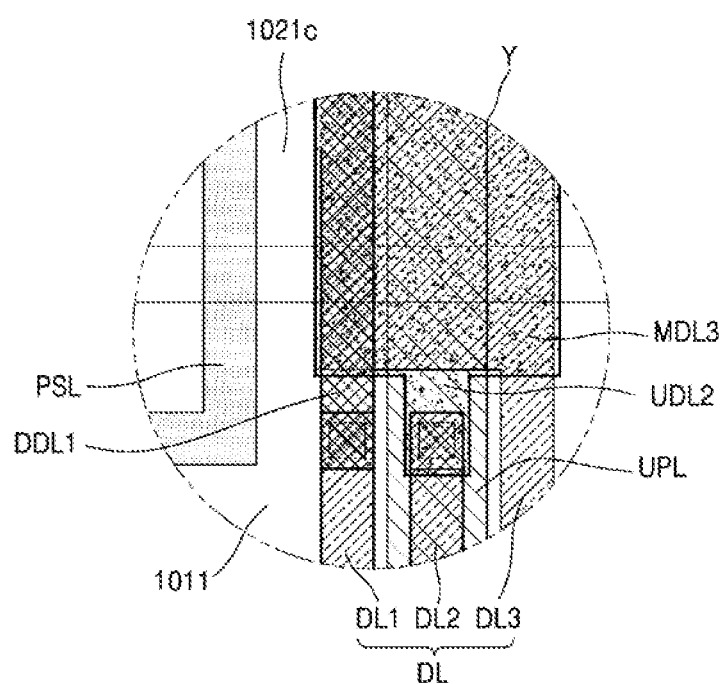
FIG. 10B is an enlarged view of portion Y in FIG. 9.
Figure 10C:
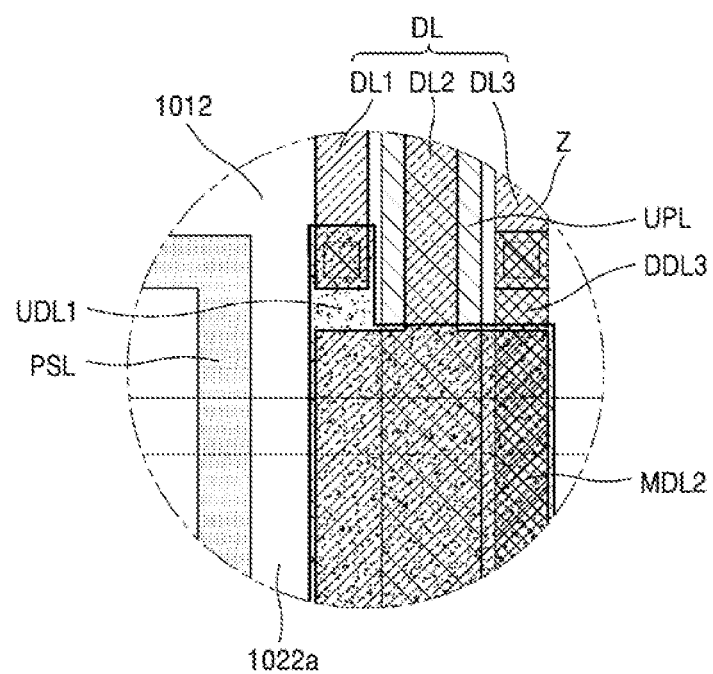
FIG. 10C is an enlarged view of portion Z in FIG. 9.

Referring to FIGS. 9 and 10B, according to an embodiment, in the third connector 1021*c* of the first island portion, the connecting wires CW include a first lower conductive pattern DDL1, a second upper conductive pattern UDL2 on the first lower conductive pattern DDL1, and a third intermediate conductive pattern MDL3 between the first lower conductive pattern DDL1 and the second upper conductive pattern UDL2. The first lower conductive pattern DDL1, the second upper conductive pattern UDL2, and the third intermediate conductive pattern MDL3 are connected to the first data line DL1, the second data line DL2, and the third data line DL3, respectively.

According to an embodiment, the first lower conductive pattern DDL1 is connected to the first data line DL1 in the first island portion 1011. In more detail, the first lower conductive pattern DDL1 is connected to the first data line DL1 through contact holes that penetrate insulating layers. The second upper conductive pattern UDL2 is connected to the second dataline DL2 in the first island portion 1011. In more detail, the second upper conductive pattern UDL2 is connected to the second data line DL2 through a contact hole that penetrates first organic insulating layer 209. The third intermediate conductive pattern MDL3 are disposed on the same layer as the third data line DL3. In this case, the third intermediate conductive pattern MDL3 is integrally formed with the third data line DL3.

In a present embodiment, in the third connector 1021*c* of the first island portion, a width of the second upper conductive pattern UDL2 is greater than a width of the second data line DL2. In this case, the second upper conductive pattern UDL2 overlaps the first lower conductive pattern DDL1 and the third intermediate conductive pattern MDL3. In the third connector 1021*c* of the first island portion, a width of the third intermediate conductive pattern MDL3 is greater than the width of the third data line DL3. The third intermediate conductive pattern MDL3 overlaps the first lower conductive pattern DDL1 and the second upper conductive pattern UDL2.

Referring to FIGS. 9 and 10C, according to an embodiment, in the first connector 1022*a* of the second island portion, the connecting wires CW include a first upper conductive pattern UDL1, a second intermediate conductive pattern MDL2 under the first upper conductive pattern UDL1, and a third lower conductive pattern DDL3 under the second intermediate conductive pattern MDL2. The first upper conductive pattern UDL1, the second intermediate conductive pattern MDL2, and the third lower conductive pattern DDL3 are connected to the first data line DL1, the second data line DL2, and the third data line DL3, respectively.

According to an embodiment, the first upper conductive pattern UDL1 is connected to the first data line DL1 in the second island portion 1012. In more detail, the first upper conductive pattern UDL1 is connected to the first data line DL through a contact hole that penetrates the first organic insulating layer 209. The second intermediate conductive pattern MDL2 is located on the same layer as that of the second data line DL2. In this case, the second intermediate conductive pattern MDL2 is integrally formed with the second data line DL2. The third lower conductive pattern DDL3 is connected to the third data line DL3 in the second island portion 1012. In this case, the third lower conductive pattern DDL3 is connected to the third data line DL3 through contact holes that penetrate the insulating layers.

In a present embodiment, in the first connector 1022*a* of the second island portion, a width of the first upper conductive pattern UDL1 is greater than the width of the first data line DL1. In this case, the first upper conductive pattern UDL1 overlaps the second intermediate conductive pattern MDL2 and the third lower conductive pattern DDL3. A width of the second intermediate conductive pattern MDL2 is greater than the width of the second data line DL2 in the first connector 1022*a* of the second island portion. In this case, the second intermediate conductive pattern MDL2 overlaps the first upper conductive pattern UDL1 and the third lower conductive pattern DDL3.

As described above, according to an embodiment, a width of at least a portion of the conductive patterns MDL, UDL and DDL is greater than a width of the data line DL so that the resistance of the conductive patterns MDL, UDL, and DDL in the connector 102 can be reduced. When the data lines DL are located on an identical layer, a width of the connector 102 increases when the width of the data lines DL is increased to reduce the resistance of each of the data lines DL. In a present embodiment, since the conductive patterns MDL, UDL, and DDL are located on different layers, the resistance of wires can be reduced without increasing the width of the connector 102.

In addition, according to an embodiment, the particular conductive patterns MDL, UDL, and DDL connected to the data lines DL are cyclically changed as described above to maintain substantially the same resistance value in each data line DL. For example, the first data line DL1 is connected to the first intermediate conductive pattern MDL1 at the first connector 1021*a* of the first island portion, to the first lower conductive pattern DDL1 at the third connector 1021*c* of the first island portion, and to the first upper conductive pattern UDL1 at the first connector 1022*a* of the second island portion. As such, the particular conductive pattern connected to the second data line DL2 and the third data line DL3 is also cyclically changed, so that a resistance value of a wire used as the data line DL can be maintained substantially the same. That is, it is possible to prevent an afterimage effect from occurring only on display elements that emit light by a specific data signal.

Referring again to FIG. 8, according to an embodiment, the lower common voltage line UPSL, the driving voltage line PL, the scan line SL, the previous scan line SIL, and the emission control line EL, and the initialization voltage line VL are provided on the second and fourth connectors 1021*b* and 1021 *d* of the first island portion.

According to an embodiment, the lower common voltage line UPSL extends to the first island portion 1011 and is connected to the common voltage line PSL. The common voltage line PSL, the driving voltage line PL, the scan line SL, the previous scan line SIL, the emission control line EL, and the initialization voltage line VL extend to the first island portion 1011 and are connected to the first display unit 200*a*.

In a present embodiment, the lower common voltage line UPSL is spaced apart from the scan line SL and the previous scan line SIL in a direction parallel to an upper surface of the substrate 100.

In FIG. 8, according to an embodiment, the lower common voltage line UPSL, the emission control line EL, and the initialization voltage line VL are spaced apart from each other. However, in some embodiments, one of the lower common voltage line UPSL, the emission control line EL, and the initialization voltage line VL overlap the other.

FIG. 11 is a cross-sectional view of a display device taken along line F-F', line G-G', and line H-H' of FIG. 8. In FIG. 11, the same reference numerals as used in FIG. 8 denote the same elements, and a duplicate description will be omitted herein.

Referring to FIG. 11, according to an embodiment, the common voltage line PSL is disposed on the lower driving voltage line UPL and the lower driving voltage line UPL is disposed on the same layer as the semiconductor layer. In addition, the data lines DL disposed on a same layer as the island portion. The data lines DL are connected to an upper conductive pattern UDL, an intermediate conductive pattern MDL, and a lower conductive pattern DDL, which are on different layers, respectively.

In a present embodiment, the lower driving voltage line UPL is disposed on the buffer layer 201 that covers the substrate 100. The lower driving voltage line UPL is covered by the gate insulating layer 203. Lower conductive patterns DDL are disposed on the gate insulating layer 203 and are covered by the first interlayer insulating layer 205. In this case, the lower driving voltage line UPL and the lower conductive patterns DDL are spaced apart from each other in a direction parallel to an upper surface of the substrate 100. For example, the lower driving voltage line UPL and the first lower conductive pattern DDL1 are spaced apart from each other in a direction parallel to the upper surface of the substrate 100. Therefore, even if the lower driving voltage line UPL includes the same material as that of the semiconductor layer, the lower driving voltage line UPL can be used as a connecting wire by being entirely doped.

According to an embodiment, the data lines DL are connected to the lower conductive patterns DDL through contact holes that penetrate the insulating layers, respectively. For example, the first data line DL1 is connected to the first lower conductive pattern DDL1 through contact holes that penetrate the first interlayer insulating layer 205 and the second interlayer insulating layer 207. The lower conductive patterns DDL include the same material as the gate electrode GE.

According to an embodiment, the data lines DL are disposed on the second interlayer insulating layer 207 that covers the first interlayer insulating layer 205. In this case, the data lines DL are spaced apart from each other. In this case, the data lines DL are integrally formed with the intermediate conductive patterns MDL, respectively. For example, the first data line DL1 is integrally formed with the first intermediate conductive pattern MDL1. The intermediate conductive patterns MDL include the same material as the source electrode SE or the drain electrode DE.

According to an embodiment, the data lines DL are connected to upper conductive patterns UDL through a contact hole that penetrates first organic insulating layer 209, respectively. For example, the first data line DL1 is connected to the first upper conductive pattern UDL1 through a contact hole that penetrates the first organic insulating layer 209. The upper conductive patterns UDL include the same material as the driving voltage line PL According to an embodiment, the second organic insulating layer 211 covers the upper conductive patterns UDL, and the common voltage line PSL is disposed on the second organic insulating layer 211. In FIG. 11, the common voltage line PSL does not overlap the lower driving voltage line UPL, the lower conductive pattern DDL, the intermediate conductive pattern MDL, or the upper conductive pattern UDL. However, in some embodiments, the common voltage line PSL overlaps at least one of the lower driving voltage line UPL, the lower conductive pattern DDL, the intermediate conductive pattern MDL, or the upper conductive pattern UDL.

Figure 12A:
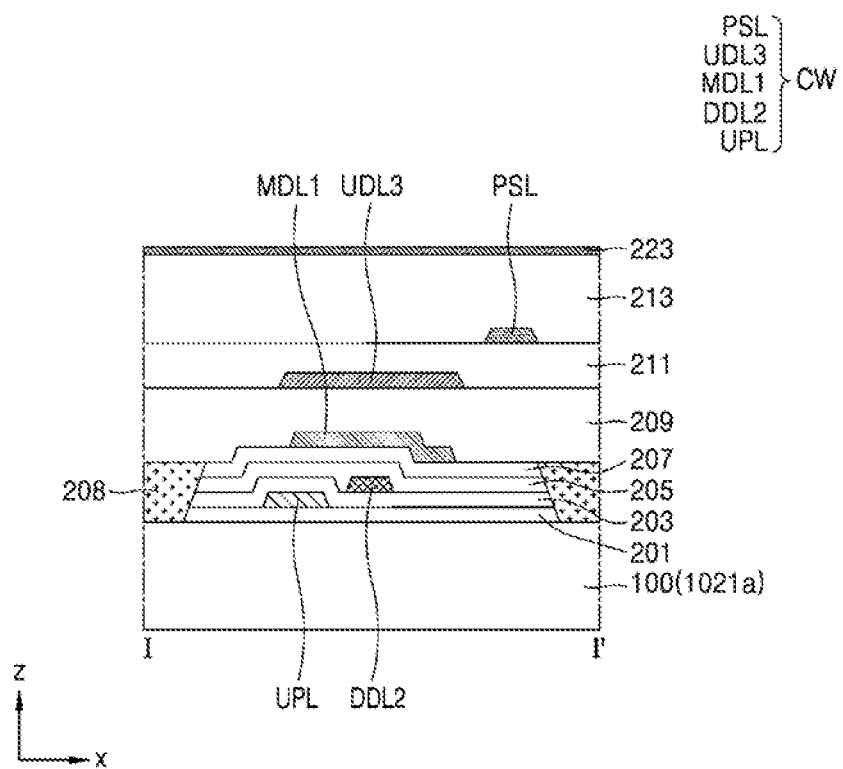
FIG. 12A is a cross-sectional view of a display device taken along line I-I' in FIG. 8.

FIG. 12A is a cross-sectional view of a display device taken along line I-I' in FIG. 8. In FIG. 12A, the same reference numerals as used in FIGS. 6 and 8 denote the same elements, and a duplicate description will be omitted herein.

Referring to FIG. 12A, according to an embodiment, the substrate 100 includes the first connector 1021a of a first island portion that extends in a first direction from the first island portion, and the first connector 1021a of the first island portion includes the connecting wires CW connected to a first display unit of the first island portion. In this case, the lower driving voltage line UPL of the connecting wires CW is disposed on the same layer as a semiconductor layer of a thin film transistor in the first display unit.

According to an embodiment, the lower driving voltage line UPL is disposed on the buffer layer 201 at the first connector 1021a of the first island portion, and the gate insulating layer 203 is disposed on the lower driving voltage line UPL and the buffer layer 201.

According to an embodiment, the second lower conductive pattern DDL2 is disposed on the gate insulating layer 203, and in one embodiment, is spaced apart from the lower driving voltage line UPL in a direction parallel to the upper surface of the substrate 100. In this case, the second lower conductive pattern DDL2 corresponds to the center of the first intermediate conductive pattern MDL1 or the third upper conductive pattern UDL3.

According to an embodiment, the first interlayer insulating layer 205 and the second interlayer insulating layer 207 sequentially cover the second lower conductive pattern DDL2 and the gate insulating layer 203, and the first intermediate conductive pattern MDL1 is disposed on the second interlayer insulating layer 207.

According to an embodiment, the first organic insulating layer 209 covers the first intermediate conductive pattern MDL1 and the second interlayer insulating layer 207, and the third upper conductive pattern UDL3 is disposed on the first organic insulating layer 209. The second organic insulating layer 211 covers the third upper conductive pattern UDL3 and the first organic insulating layer 209, and the common voltage line PSL is disposed on the second organic insulating layer 211. In addition, the third organic insulating layer 213 covers the common voltage line PSL and the second organic insulating layer 211, and the opposite electrode 223 is disposed on the third organic insulating layer 213.

In a present embodiment, one of the second lower conductive pattern DDL2, the first intermediate conductive pattern MDL1, or the third upper conductive pattern UDL3 may overlap the other thereof.

Figure 12B:
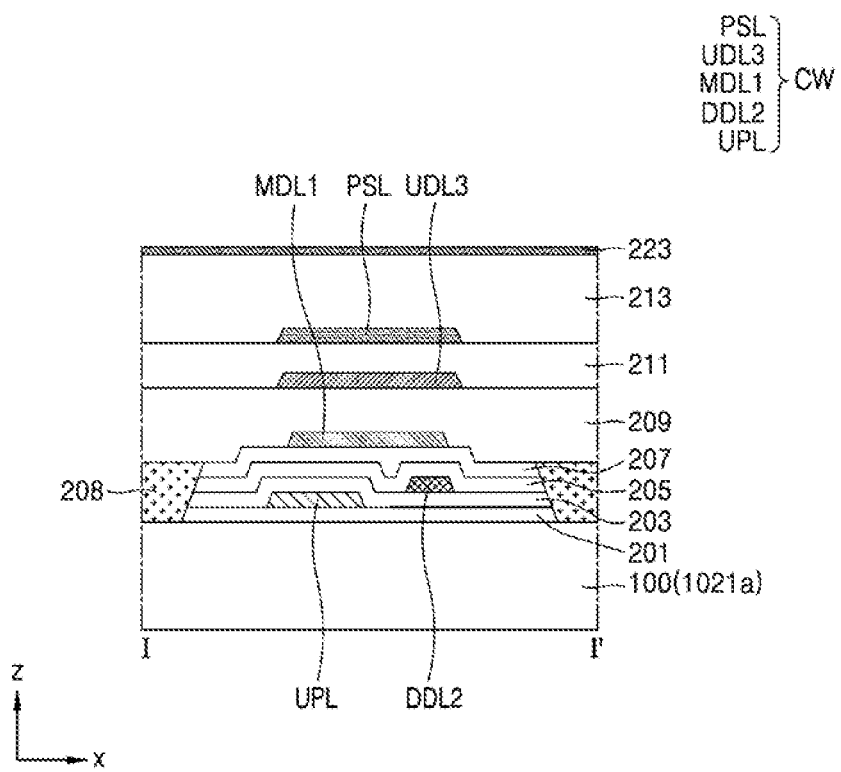
FIG. 12B is a cross-sectional view of a display device taken along line I-I' in FIG. 8 according to an embodiment.

FIG. 12B is a cross-sectional view of a display device taken along line I-I' in FIG. 8 according to an embodiment. In FIG. 12B, the same reference numerals as used in FIG. 12A denote the same elements, and a duplicate description will be omitted herein.

Referring to FIG. 12B, according to an embodiment, the center of the first intermediate conductive pattern MDL1 corresponds to the center of the lower driving voltage line UPL and the center of the second lower conductive pattern DDL2. In addition, the common voltage line PSL overlaps the third upper conductive pattern UDL3. In an embodiment, a width of the common voltage line PSL is greater than a width of the second lower conductive pattern DDL2. Moreover, in FIG. 12B, a width of the lower driving voltage line UPL is less than the width of the common voltage line PSL. However, in some embodiments, the width of the lower driving voltage line UPL is equal to the width of the common voltage line PSL In a present embodiment, the lower driving voltage line UPL, the first intermediate conductive pattern MDL1, the second lower conductive pattern DDL2, the third upper conductive pattern UDL3, and the common voltage line PSL are located on different layers, and at least some of them overlap each other. Therefore, a width of the first connector 1021a of the first island portion can be minimized.

Figure 13:
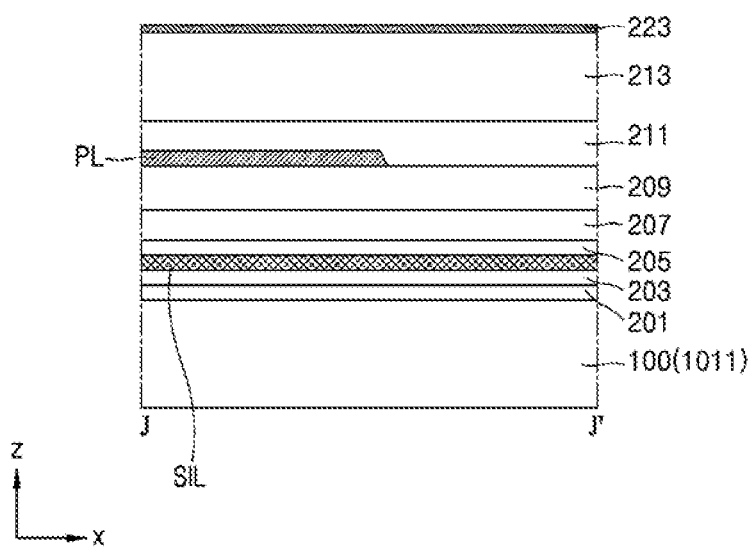
FIG. 13 is a cross-sectional view of a display device taken along line J-J' in FIG. 8.

FIG. 13 is a cross-sectional view of a display device taken along line J-J' in FIG. 8. In FIG. 13, the same reference numerals as used in FIG. 8 denote the same elements, and a duplicate description will be omitted herein.

Referring to FIG. 13, according to an embodiment, the substrate 100 includes the first island portion 1011 and a second connector 1021b of the first island portion that extends in a second direction (−x direction) from the first island portion 1011, and the second connector 1021b of the first island portion 1011 includes connecting wires connected to the first display unit 200a of the first island portion 1011.

In a present embodiment, the previous scan line SIL is disposed on the gate insulating layer 203, and the first interlayer insulating layer 205 covers the previous scan line SIL.

According to an embodiment, the second interlayer insulating layer 207 and the first organic insulating layer 209 are disposed on the first interlayer insulating layer 205, and the driving voltage line PL is disposed on the first organic insulating layer 209. In this case, the previous scan line SIL and the driving voltage line PL overlap each other.

According to an embodiment, the second organic insulating layer 211, the third organic insulating layer 213, and the opposite electrode 223 are sequentially disposed on the driving voltage line PL.

Figure 14:
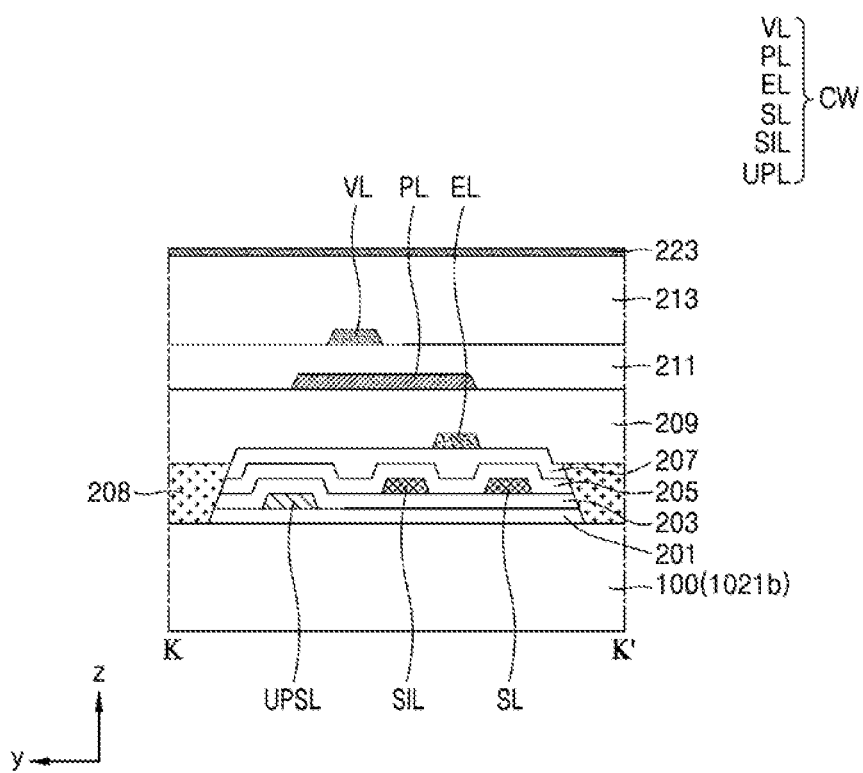
FIG. 14 is a cross-sectional view of a display device taken along line K-K' in FIG. 8.

FIG. 14 is a cross-sectional view of a display device taken along line K-K' in FIG. 8. In FIG. 14A, the same reference numerals as used in FIGS. 6 and 8 denote the same elements, and a duplicate description will be omitted herein.

Referring to FIG. 14, according to an embodiment, the substrate 100 includes a first island portion 1011 and the second connector 1021b of the first island portion that extends in a second direction from the first island portion, and the second connector 1021b of the first island portion

1011 includes the connecting wires CW connected to a first display unit 200a of the first island portion 1011. In this case, the lower common voltage line UPSL of the connecting wires CW are disposed on the same layer as a semiconductor layer of a thin film transistor in the first display unit 200a.

According to an embodiment, the lower common voltage line UPSL is disposed on the buffer layer 201 at the second connector 1021b of the first island portion 1011, and the gate insulating layer 203 is disposed on the lower common voltage line UPSL.

According to an embodiment, the scan line SL and the previous scan line SIL are disposed on the gate insulating layer 203. In a present embodiment, the lower common voltage line UPSL is spaced apart from the scan line SL and the previous scan line SIL in a direction parallel to an upper surface of the substrate 100, and the scan line SL is spaced apart from the previous scan line SIL in a direction parallel to an upper surface of the substrate 100. Therefore, even if the lower common voltage line UPSL includes the same material as that of the semiconductor layer, the lower common voltage line UPSL can be used as a connecting wire by being entirely doped.

According to an embodiment, the first interlayer insulating layer 205 and the second interlayer insulating layer 207 are disposed on the gate insulating layer 203, the scan line SL and the previous scan line SIL The emission control line EL is disposed on the second interlayer insulating layer 207. In some embodiments, another wire may be further disposed on the second interlayer insulating layer 207.

According to an embodiment, the first organic insulating layer 209 covers the emission control line EL and the second interlayer insulating layer 207, and the driving voltage line PL is disposed on the first organic insulating layer 209. The driving voltage line PL overlaps at least some of the lower common voltage line UPSL, the scan line SL, the previous scan line SIL, and the emission control line EL.

According to an embodiment, the second organic insulating layer 211 covers the driving voltage line PL and the first organic insulating layer 209, and the initialization voltage line VL is disposed on the second organic insulating layer 211. In some embodiments, the initialization voltage line VL includes a first initialization voltage line and a second initialization voltage line spaced apart from the first initialization voltage line. In this case, the first initialization voltage line and the second initialization voltage line are disposed on the second organic insulating layer 211.

According to an embodiment, the third organic insulating layer 213 covers the initialization voltage line VL and the second organic insulating layer 211, and the opposite electrode 223 is disposed on the third organic insulating layer 213.

As described above, according to an embodiment, since the connecting wires CW overlap each other in a direction perpendicular to the upper surface of the substrate 100, a width of the second connector 1021b of the first island portion can be minimized.

Figure 15:
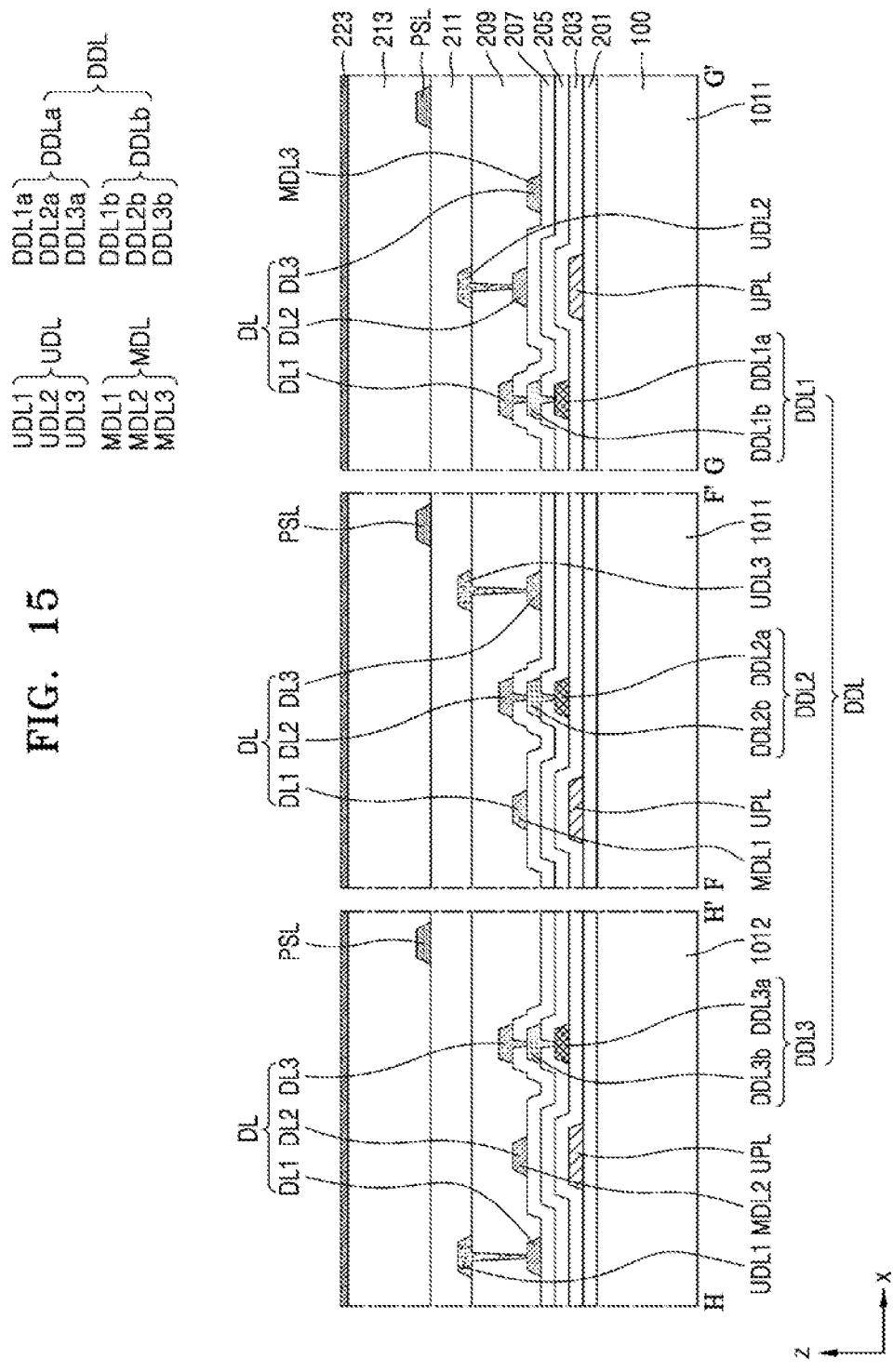
FIG. 15 is a cross-sectional view of a display device taken along line F-F', G-G', and H-H' of FIG. 8 according to an embodiment.

FIG. 15 is a cross-sectional view of a display device taken along line F-F', G-G', and H-H' of FIG. 8 according to an embodiment. In FIG. 15, the same reference numerals as used in FIGS. 8 and 11 denote the same elements, and a duplicate description will be omitted herein.

Referring to FIG. 15, according to an embodiment, the common voltage line PSL is on the lower driving voltage line UPL, which is disposed on the same layer as the semiconductor layer. In addition, the data lines DL are disposed on the same layer on the island portion 101. The data lines DL are connected to an upper conductive pattern UDL, an intermediate conductive pattern MDL, and a lower conductive pattern DDL which are on different layers, respectively.

In a present embodiment, the lower conductive pattern DDL includes a first conductive pattern DDLa and a second conductive pattern DDLb. The first conductive pattern DDLa includes a same material as the gate electrode GE. The second conductive pattern DDLb includes the same material as the upper electrode CE2.

According to an embodiment, the first conductive pattern DDLa is disposed on the gate insulating layer 203, and the second conductive pattern DDLb is disposed on the first interlayer insulating layer 205. The first conductive pattern DDLa and the second conductive pattern DDLb are connected to each other through a contact hole that penetrates the first interlayer insulating layer 205. The second conductive pattern DDLb and the data line DL are connected to each other through a contact hole that penetrates the second interlayer insulating layer 207.

For example, according to an embodiment, the first lower conductive pattern DDL1 includes a first conductive pattern DDL1a and a second conductive pattern DDL1b. The first conductive pattern DDL1a is connected to the second conductive pattern DDL1b through the contact hole that penetrates the first interlayer insulating layer 205. The second conductive pattern DDL1b is connected to the first data line DL1 through the contact hole that penetrates the second interlayer insulating layer 207.

As another example, according to an embodiment, the second lower conductive pattern DDL2 includes a first conductive pattern DDL2a and a second conductive pattern DDL2b. The first conductive pattern DDL2a is connected to the second conductive pattern DDL2b through the contact hole that penetrates the first interlayer insulating layer 205. The second conductive pattern DDL2b is connected to the second data line DL2 through the contact hole that penetrates the second interlayer insulating layer 207.

As another example, the third lower conductive pattern DDL3 includes a first conductive pattern DDL3a and a second conductive pattern DDL3b. The first conductive pattern DDL3a is connected to the second conductive pattern DDL3b through the contact hole that penetrates the first interlayer insulating layer 205. The second conductive pattern DDL3b is connected to the third data line DL3 through the contact hole that penetrates the second interlayer insulating layer 207.

Therefore, according to an embodiment, the resistance of the lower conductive pattern DDL can be reduced, and afterimages that may occur due to high resistance can be prevented.

Figure 16:
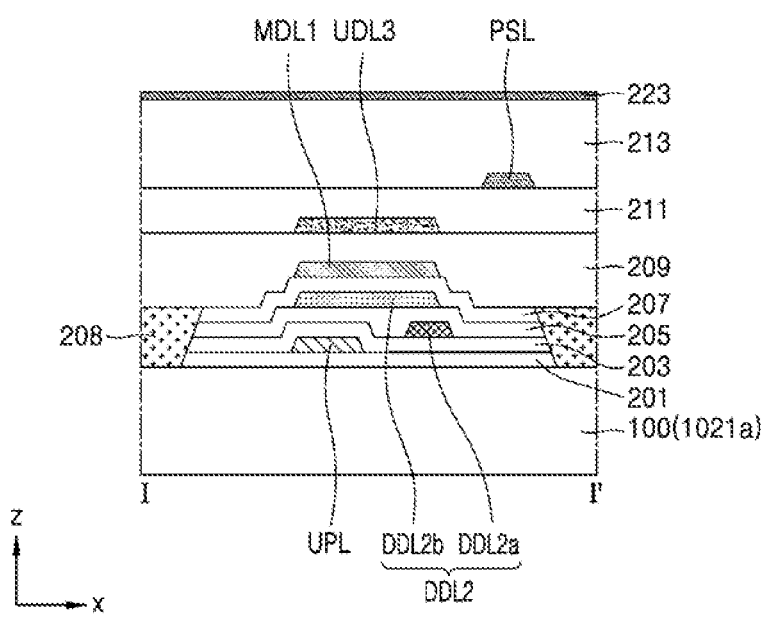
FIG. 16 is a cross-sectional view of a display device taken along line I-I' of FIG. 8 according to an embodiment.

FIG. 16 is a cross-sectional view of a display device taken along line I-I' of FIG. 8 according to an embodiment. In FIG. 16, the same reference numerals as used in FIG. 12A denote the same elements, and a duplicate description will be omitted herein.

As another example, according to an embodiment, the second lower conductive pattern DDL2 includes the first conductive pattern DDL2a and the second conductive pattern DDL2b. In this case, the first conductive pattern DDL2a is disposed on the gate insulating layer 203, and is spaced apart from the lower driving voltage line UPL in a direction parallel to an upper surface of the substrate 100.

In a present embodiment, the second conductive pattern DDL2b is disposed on the first interlayer insulating layer 205. In this case, at least a portion of the second conductive pattern DDL2b overlaps the lower driving voltage line UPL disposed on the buffer layer 201. Therefore, a width of the first connector 1021*a* of the first island portion 1011 can be minimized. In addition, the second conductive pattern DDL2*b* overlaps the first intermediate conductive pattern MDL1.

According to an embodiment, since the first conductive pattern DDL2*a* and the second conductive pattern DDL2*b* are disposed on different layers, the resistance of the second lower conductive pattern DDL2 can be reduced. As a result, afterimages that may occur due to high resistance can be prevented. In addition, since the connecting wires overlap each other on different layers, the width of the first connector 1021*a* of the first island portion 1011 can be minimized.

Figure 17:
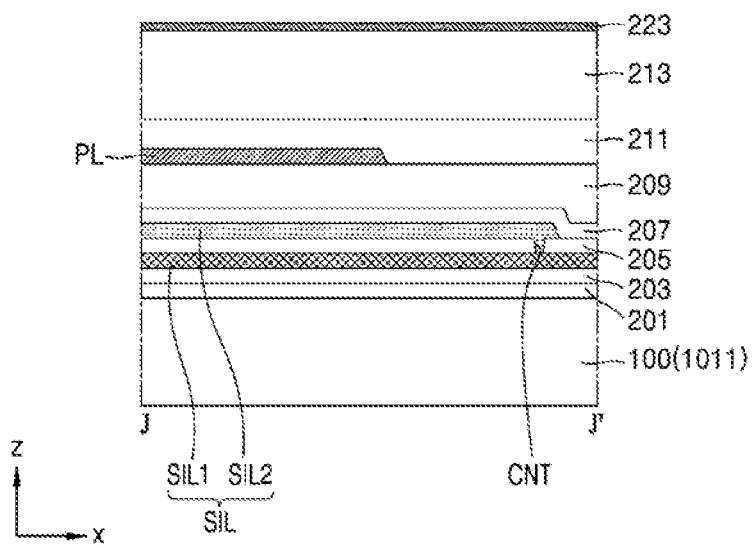
FIG. 17 is a cross-sectional view of a display device taken along line J-J' of FIG. 8 according to an embodiment.

FIG. 17 is a cross-sectional view of a display device taken along line J-J' of FIG. 8 according to an embodiment. In FIG. 17, the same reference numerals as used in FIG. 13 denote the same elements, and a duplicate description will be omitted herein.

Referring to FIG. 17, according to an embodiment, the previous scan line SIL includes a first previous scan line SIL1 and a second previous scan line SIL2. The first previous scan line SIL1 is disposed on the gate insulating layer 203, and the second previous scan line SIL2 is disposed on the first interlayer insulating layer 205 that covers the first previous scan line SIL1. The first previous scan line SIL1 and the second previous scan line SIL2 are connected to each other through a contact hole CNT. In more detail, the first previous scan line SIL1 is connected to the second previous scan line SIL2 through the contact hole CNT in the first interlayer insulating layer 205. Therefore, the resistance of the previous scan line SIL can be reduced, and afterimages that may occur due to high resistance can be prevented.

Figure 18:
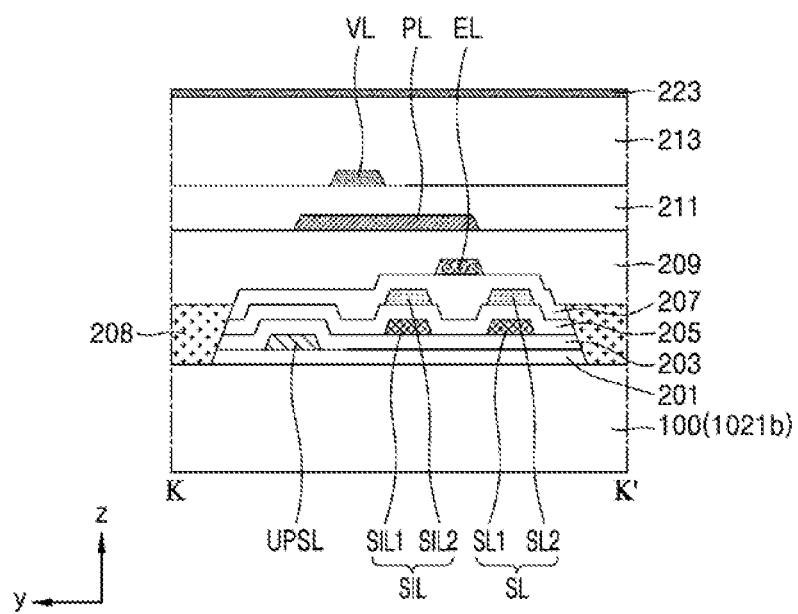
FIG. 18 is a cross-sectional view of a display device taken along line K-K' of FIG. 8 according to an embodiment.

FIG. 18 is a cross-sectional view of a display device taken along line K-K' of FIG. 8 according to an embodiment. In FIG. 18, the same reference numerals as used in FIG. 14 denote the same elements, and a duplicate description will be omitted herein.

Referring to FIG. 18, the first interlayer insulating layer 205, the scan line SL includes a first scan line SL1 and a second scan line SL2, and the previous scan line SIL may include the first previous scan line SIL1 and the second previous scan line SIL2.

According to an embodiment, the first scan line SL1 and the first previous scan line SIL1 are disposed on the gate insulating layer 203. In a present embodiment, the lower common voltage line UPSL is spaced apart from the first scan line SL1, and the first previous scan line SIL1 in a direction parallel to the upper surface of the substrate 100. Therefore, even if the lower common voltage line UPSL includes the same material as the semiconductor layer, the lower common voltage line UPSL can be used as a connecting wire by being entirely doped.

According to an embodiment, the second scan line SL2 and the second previous scan line SIL2 are disposed on the first interlayer insulating layer 205. FIG. 18 illustrates that the second scan line SL2 and the second previous scan line SIL2 overlap the first scan line SL1 and the first previous scan line SIL1, respectively. However, in some embodiments, they do not overlap.

In some embodiments, the second scan line SL2 and the second previous scan line SIL2 overlap the lower common voltage line UPSL. In addition, in other embodiments, the second scan line SL2 and the second previous scan line SIL2 overlap at least one of the emission control line EL, the driving voltage line PL, or the initialization voltage line VL.

According to an embodiment, since the scan lines SL and the previous scan lines SIL are disposed on different layers, the resistances of the scan lines SL and the previous scan lines SIL can be reduced, respectively, and afterimages that may occur due to high resistance can be prevented. In addition, since the connecting wires overlap each other, the width of the second connector 1021*b* of the first island portion can be minimized.

Moreover, although a display device according to various embodiments has been described using the terms of the lower driving voltage line UPL and the lower common voltage line UPSL, the lower driving voltage line UPL may be understood as a first wire, and the lower common voltage line UPSL may be understood as a second wire.

As described above, according to embodiments, a display device is provided that can minimize a width of a connector where wires are disposed. Therefore, embodiments provide a high resolution display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
a substrate that includes an island portion, a first connector that extends from the island portion in a first direction, and a second connector that extends from the island portion in a second direction that crosses the first direction;
a display unit that includes at least one thin film transistor disposed on the island portion and at least one display element connected to the at least one thin film transistor; and
connecting wires disposed on the first connector and the second connector and connected to the display unit, wherein each of a semiconductor layer of the at least one thin film transistor and at least one of the connecting wires are disposed directly on a same layer, and
wherein the connecting wires include a first wire and a second wire that overlap each other in a thickness direction that is normal to the first direction and the second direction and extend parallel to each other where they overlap, the first wire on the first connector is disposed on the same layer as the semiconductor layer and the second wire on the first connector is electrically connected to an opposite electrode of the at least one display element.

2. The display device of claim 1, wherein a plurality of insulating layers are interposed between the first wire and the second wire.

3. The display device of claim 1, wherein
a first data line, a second data line, and a third data line connected to the display unit are disposed on the island portion, and
the connecting wires of the first connector comprise:
an intermediate conductive pattern connected to the first data line that is disposed on a same layer as the intermediate conductive pattern;
a lower conductive pattern disposed below the intermediate conductive pattern and connected to the second data line; and an upper conductive pattern disposed on the intermediate conductive pattern and connected to the third data line.

4. The display device of claim 3, wherein at least one insulating layer is interposed between the upper conductive pattern and the intermediate conductive pattern.

5. The display device of claim 3, wherein the lower conductive pattern and the first wire are spaced apart from each other in a direction parallel to an upper surface of the substrate.

6. The display device of claim 3, wherein
the lower conductive pattern includes a first conductive pattern and a second conductive pattern with at least one first insulating layer interposed therebetween, and
at least one second insulating layer is interposed between the second conductive pattern and the intermediate conductive pattern.

7. The display device of claim 6, wherein the first conductive pattern and the second conductive pattern extend to the island portion and are connected to each other through a contact hole that penetrates the at least one first insulating layer.

8. The display device of claim 3,
wherein the connecting wires are also disposed on a third connector that extends from the island portion in a direction parallel to the first direction,
wherein the third connector comprises:
the lower conductive pattern connected to the first data line;
the upper conductive pattern connected to the second data line; and
the intermediate conductive pattern connected to the third data line.

9. The display device of claim 1, wherein
the second wire on the second connector is electrically connected to the opposite electrode of the display element, and
the first wire on the second connector is disposed on and overlaps the second wire in the thickness direction, wherein the second wire is disposed on the same layer as the semiconductor layer.

10. The display device of claim 9, wherein an insulating layer is interposed between the first wire and the second wire.

11. The display device of claim 9, wherein
the connecting wires further include at least one scan line that transmits a scan signal, and
the at least one scan line is disposed on a first insulating layer that covers the second wire.

12. The display device of claim 11, wherein the at least one scan line and the second wire are spaced apart from each other in a direction parallel to an upper surface of the substrate.

13. The display device of claim 11,
wherein the at least one scan line includes a first scan line and a second scan line,
wherein the first scan line is disposed on the first insulating layer that covers the second wire, and the second scan line is disposed on a second insulating layer that covers the first scan line.

* * * * *